(12) United States Patent
Itonaga

(10) Patent No.: US 8,717,468 B2
(45) Date of Patent: May 6, 2014

(54) SOLID-STATE IMAGING DEVICES AND ELECTRONIC DEVICES WITH SHORT WAVELENGTH ABSORPTION FILM OVER HIGHER WAVELENGTH PHOTOELECTRIC CONVERSION PORTION

(75) Inventor: Kazuichiro Itonaga, Tokyo (JP)

(73) Assignee: Sony Corporation (JP)

( * ) Notice: Subject to any disclaimer, the term of this patent is extended or adjusted under 35 U.S.C. 154(b) by 419 days.

(21) Appl. No.: 12/464,557

(22) Filed: May 12, 2009

(65) Prior Publication Data
US 2009/0284630 A1 Nov. 19, 2009

(30) Foreign Application Priority Data
May 13, 2008 (JP) .................. 2008-126320

(51) Int. Cl.
H04N 3/14 (2006.01)
H04N 5/335 (2011.01)

(52) U.S. Cl.
USPC ........... 348/294; 348/273; 257/437; 257/290; 257/294

(58) Field of Classification Search
USPC .............. 348/273, 294; 257/437, 290, 294
See application file for complete search history.

(56) References Cited

U.S. PATENT DOCUMENTS

| 4,577,098 | A  | * | 3/1986  | Ogawa          | 250/216 |
|-----------|----|---|---------|----------------|---------|
| 6,885,020 | B2 | * | 4/2005  | Arakawa et al. | 250/586 |
| 7,132,724 | B1 | * | 11/2006 | Merrill        | 257/440 |
| 7,656,446 | B2 | * | 2/2010  | Shizukuishi    | 348/275 |
| 7,902,623 | B2 | * | 3/2011  | Furukawa et al.| 257/437 |
| 7,910,961 | B2 | * | 3/2011  | Mao et al.     | 257/258 |
| 2001/0035526 | A1 | * | 11/2001 | Yamazaki et al. | 257/57 |
| 2001/0040655 | A1 | * | 11/2001 | Yamazaki et al. | 349/110 |
| 2002/0130282 | A1 | * | 9/2002  | Arakawa et al.  | 250/586 |
| 2004/0179120 | A1 | * | 9/2004  | Shizukuishi     | 348/272 |
| 2005/0017301 | A1 | * | 1/2005  | Iwatsu et al.   | 257/344 |
| 2005/0103983 | A1 | * | 5/2005  | Yamaguchi et al.| 250/214.1 |
| 2006/0086956 | A1 | * | 4/2006  | Furukawa et al. | 257/291 |
| 2007/0023852 | A1 | * | 2/2007  | Okawa et al.    | 257/440 |
| 2007/0114626 | A1 | * | 5/2007  | Kang et al.     | 257/431 |
| 2008/0035965 | A1 | * | 2/2008  | Hayashi et al.  | 257/291 |
| 2008/0185619 | A1 | * | 8/2008  | Merrill         | 257/292 |
| 2008/0283842 | A1 | * | 11/2008 | Hayashi et al.  | 257/72 |
| 2008/0296629 | A1 | * | 12/2008 | Mabuchi         | 257/233 |
| 2010/0151613 | A1 | * | 6/2010  | Mabuchi         | 438/59 |

FOREIGN PATENT DOCUMENTS

| JP | 09-148549   | 6/1997  |
| JP | 2000-012814 | 1/2000  |
| JP | 2002-151670 | 5/2002  |
| JP | 2005-142221 | 6/2005  |
| JP | 2007-258684 | 10/2007 |

* cited by examiner

Primary Examiner — Antoinette Spinks
(74) Attorney, Agent, or Firm — Sheridan Ross P.C.

(57) ABSTRACT

A solid-state imaging device is disclosed. The solid-state image device has pixels in which an absorption film that absorbs short wavelength-side light is formed on a photoelectric conversion portion for desired color light through an insulation film.

21 Claims, 16 Drawing Sheets

A - A

B - B

A - A

B - B

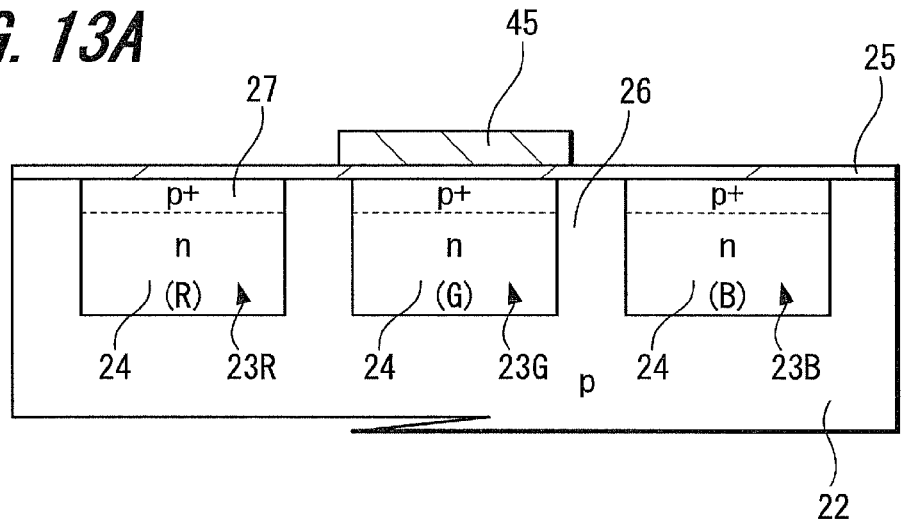
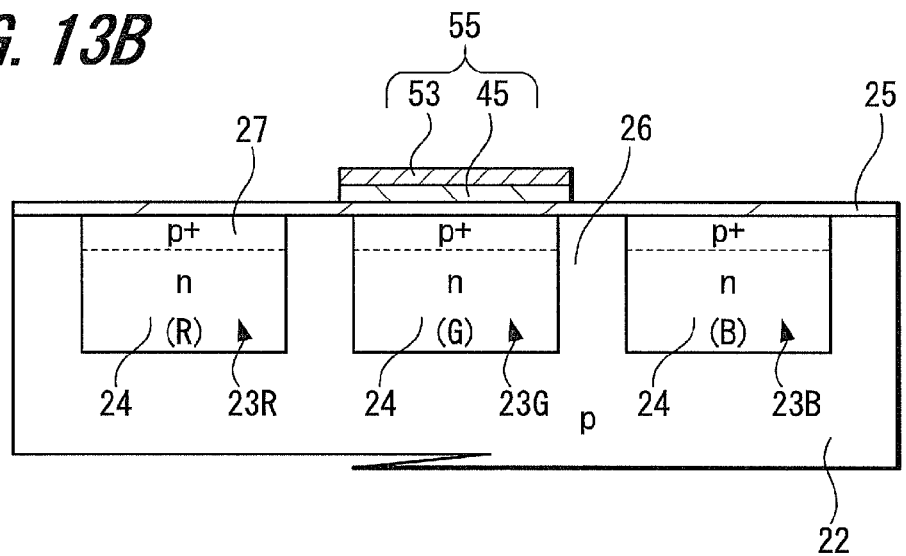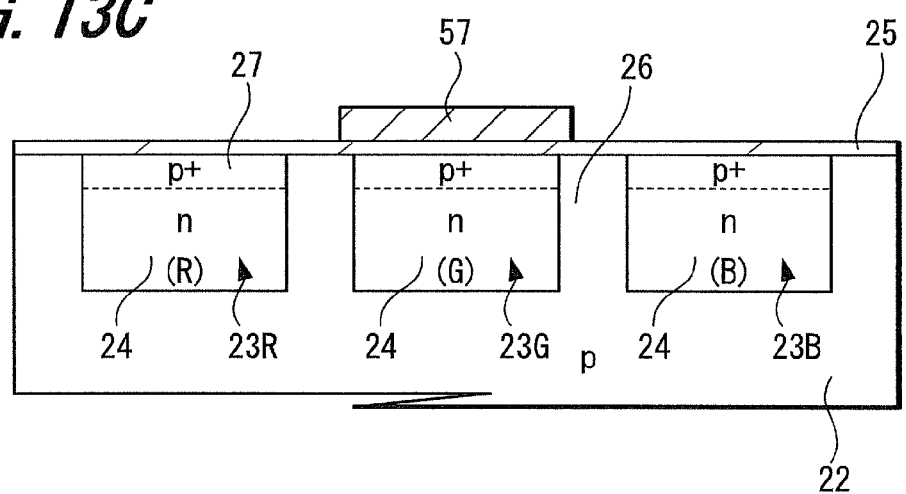

SOLID-STATE IMAGING DEVICES AND ELECTRONIC DEVICES WITH SHORT WAVELENGTH ABSORPTION FILM OVER HIGHER WAVELENGTH PHOTOELECTRIC CONVERSION PORTION

BACKGROUND OF THE INVENTION

1. Field of the Invention

The present invention relates to solid-state imaging devices such as CMOS image sensors and CCD image sensors and to electronic devices such as a camera having such a solid-state imaging device.

2. Description of the Related Art

Solid-state imaging devices are categorized as amplification type solid-state imaging devices typified by CMOS image sensors and charge transfer type solid-state imaging devices typified by CCD image sensors. When the CMOS image sensors are compared with the CCD image sensors, since the latter type necessarily uses a higher voltage to transfer signal charges than that of the former type, the power voltage applied to the latter type becomes higher than that applied to the former type. Thus, more CMOS image sensors have been used as solid-state imaging devices for mobile devices such as mobile phones with a built-in camera and personal digital assistants (PDAs) than CCD image sensors because the former type uses a lower power voltage and consumes a lower power than does the latter type.

Japanese Unexamined Patent Application Publication No. HEI 9-148549, hereinafter referred to as Patent Document 1, discloses a solid-state imaging device in which heights of on-chip lenses for individual colors are changed for high color reproducibility such that differences of sensitivities caused by differences of colors of color filters are removed.

Japanese Unexamined Patent Application Publication No. 2000-12814, hereinafter referred to as Patent Document 2, discloses a solid-state imaging device in which color filters for individual colors are formed with respective film thicknesses corresponding to desired spectral characteristics for high color reproducibility such that desired spectral sensitivity characteristics are obtained.

Japanese Unexamined Patent Application Publication No. 2002-151670, hereinafter referred to as Patent Document 3, discloses a solid-state imaging device in which the curvatures of inner-layer lenses are changed corresponding to arranged colors such that smearing, which occurs in miniaturizing pixels, is suppressed and sensitivity is prevented from lowering.

Japanese Unexamined Patent Application Publication No. 2005-142221, hereinafter referred to as Patent Document 4, discloses a backside-illuminated CMOS solid-state imaging device in which a silicon layer is formed with a thickness of 10 μm or less such that pixels are miniaturized with high sensitivities.

Japanese Unexamined Patent Application Publication No. 2007-258684, hereinafter referred to as Patent Document 5, discloses a solid-state imaging device in which a hafnium film having fixed negative charges is formed such that holes are accumulated on the front surface of each photodiode.

SUMMARY OF THE INVENTION

In a solid-state imaging device, photoelectric conversion portions, namely photodiodes, for red (R), green (G), and blue (B) have respective spectral sensitivity characteristics shown in FIG. 1. FIG. 1 shows spectral sensitivity characteristics in a semiconductor, namely silicon. The spectral sensitivity characteristics shown in FIG. 1 represent wavelength dependencies. In FIG. 1, the horizontal axis represents light wavelengths and the vertical axis represents relative ratios of spectral sensitivities. In FIG. 1, curve 1R represents a spectral sensitivity characteristic for red (R), curve $2G_1$ represents a spectral sensitivity characteristic for green (G), and curve 3B represents a spectral sensitivity characteristic for blue (B). An insulation film, for example, a silicon nitride film has been formed on the front surface of each photodiode. Since the silicon nitride film absorbs light having a blue wavelength range of 400 nm to 500 nm, the blue sensitivity of the silicon nitride film is lower than each of the red sensitivity and green sensitivity thereof.

Taking into account of the spectral sensitivity characteristic $2G_1$ for green, the short-wavelength side of the trough portion of the curve intersects with the spectral sensitivity curve 3B for blue, whereas the long-wavelength side of the trough portion of the curve intersects with the spectral sensitivity curve 1R for red. The higher the short-wavelength side intersection (so-called cross point) a1 and the long-wavelength side intersection b1 are, the more color mixtures (crosstalk between pixels), namely color noises, occur in silicon. On the spectral sensitivity curve $2G_1$ for green, the shorter wavelength side of the cross point a1 is referred to as a float 5, whereas the longer wavelength side of the cross point b1 is referred to as a float 6.

In a solid-state imaging device, when the cross points a1 and b1 can be lowered, color mixtures (crosstalk between pixels) in semiconductors can be decreased. As pixels are being further miniaturized, it is desired to decrease color mixtures (crosstalk between pixels) in semiconductors without a tradeoff of decreases of peak sensitivities of individual colors.

In view of the foregoing, it would be desirable to provide a solid-state imaging device that can decrease color mixtures (crosstalk between pixels) in semiconductors of photoelectric conversion portions that compose corresponding pixels without a tradeoff of decreases of peak sensitivities of individual colors.

In addition, it would be desirable to provide an electronic device having a solid-state imaging device that can decrease such color mixtures (crosstalk between pixels).

According to an embodiment of the present invention, there is provided a solid-state imaging device having pixels in which an absorption film that absorbs short wavelength-side light is formed on a photoelectric conversion portion for desired color light through an insulation film.

In the solid-state imaging device according to this embodiment, the absorption film is formed on the photoelectric conversion portions of pixels. The absorption film absorbs the short-wavelength side light of desired color light that enters a corresponding photoelectric conversion portion, resulting in a decrease of the short-wavelength side float on the spectral sensitivity curve.

According to an embodiment of the present invention, there is provided an electronic device including a solid-state imaging device, an optical system, and a signal processing circuit. The optical system configured to guide incident light to a photoelectric conversion portion of the solid-state imaging device. The signal processing circuit processes an output signal of the solid-state imaging device. The solid-state imaging device has pixels in which an absorption film that absorbs short-wavelength side light is formed on a photoelectric conversion portion for desired color light through an insulation film.

In the electronic device according to this embodiment, the absorption film is formed on the photoelectric conversion portions of pixels. The absorption film absorbs the short-wavelength side light of desired color light that enters a corresponding photoelectric conversion portion, resulting in a decrease of the short-wavelength side float on the spectral sensitivity curve.

In the photoelectric conversion portion for desired color light of the solid-state imaging device according to an embodiment of the present invention, since the short-wavelength side float on the spectral sensitivity curve decreases, color mixtures (crosstalk between pixels), namely color noises, in the photoelectric conversion portion can be decreased without a tradeoff of a decrease of peak sensitivity.

Since the electronic device according to an embodiment of the present invention has the foregoing solid-state imaging device, color mixtures (crosstalk between pixels) in a photoelectric conversion portion are decreased and thereby image quality is improved.

BRIEF DESCRIPTION OF THE DRAWINGS

The invention will become more fully understood from the following detailed description, taken in conjunction with the accompanying drawings, wherein similar reference numerals denote corresponding elements, in which:

FIG. 13A, FIG. 13B, and FIG. 13C are schematic diagrams showing structures of principal portions of modifications of embodiments of the present invention;

DETAILED DESCRIPTION OF THE PREFERRED EMBODIMENTS

Figure 1:
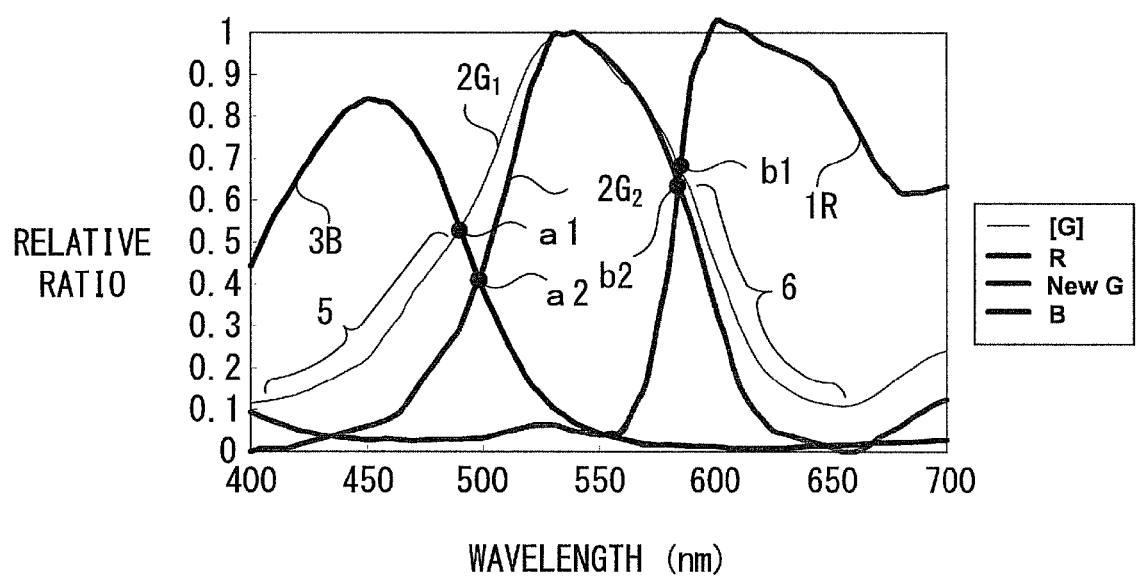
FIG. 1 is a schematic diagram showing spectral sensitivity characteristics describing an embodiment of the present invention.

Next, with reference to the accompanying drawings, embodiments of the present invention will be described.

Solid-state imaging devices according to embodiments and their modifications of the present invention can be applied to CMOS solid-state imaging devices and CCD solid-state imaging devices.

Next, an outlined structure of a CMOS solid-state imaging device according to an embodiment of the present invention will be described. This CMOS solid-state imaging device includes a semiconductor substrate, an imaging region on which a plurality of pixels are arranged two-dimensionally on the semiconductor substrate, for example, a silicon substrate, and a peripheral circuit section. Each of the pixels is made of a photoelectric conversion portion that senses light and generates signal charges and a plurality of pixel transistors (so-called MOS transistors). Pixel transistors can be made of four transistors, for example, a transfer transistor, a reset transistor, an amplification transistor, and a selection transistor. Instead, pixel transistors may be made of three transistors, for example, a transfer transistor, a reset transistor, and an amplification transistor omitting a selection transistor. Pixel transistors may be made of other combinations of these transistors.

The peripheral circuit section includes, for example, a vertical drive circuit, column signal processing circuits, a horizontal drive circuit, an output circuit, and a control circuit.

The control circuit generates a clock signal and a control signal that cause the vertical drive circuit, the column signal processing circuit, the horizontal drive circuit, and so forth to operate based on a vertical synchronous signal, a horizontal synchronous signal, and a master clock and inputs these signals to the vertical drive circuit, the column signal processing circuits, the horizontal drive circuits, and so forth.

The vertical drive circuit is made, for example, of a shift register. The vertical drive circuit selectively scans each line of pixels in the imaging region in the vertical direction and supplies pixel signals generated by a photoelectric conversion portion of each pixel based on signal charges generated corresponding to the amount of sensed light to the column signal processing circuits through corresponding vertical signal lines.

The column signal processing circuits are disposed corresponding, for example, to respective columns of pixels. The column signal processing circuits each perform signal processes including noise reduction and signal amplification for signals that are output from pixels for one line with signals supplied from black reference pixels (those formed around an effective pixel region). A horizontal selection switch is connected and disposed between an output stage of each column signal processing circuit and a horizontal signal line.

The horizontal drive circuit is made, for example, of a shift register. The horizontal drive circuit successively outputs horizontal scanning pulses, successively selects the column signal processing circuits, and outputs pixel signals of the column signal processing circuits to the horizontal signal line.

The output circuit performs a signal process for signals successively supplied from the respective column signal processing circuits through the horizontal signal line and outputs the resultant signals.

In a frontside-illuminated CMOS solid-state imaging device, a plurality of wiring layers on each of which a wiring is formed through an insulating interlayer are formed on pixels that are formed on the substrate. On the plurality of wiring layers, on-chip color filters are formed through a planalizing layer. On the on-chip color filters, on-chip micro lenses are formed. A light-shielding film is formed in an area for other than pixels of the imaging region, more specifically, in an area for other than the peripheral circuit portion and the photoelectric conversion portions of the imaging region. The light-shielding film can be formed, for example, of a wiring of the top layer of the plurality of wiring layers.

Next, an outlined structure of a CCD solid-state imaging device according to an embodiment of the present invention will be described. This CCD solid-state imaging device includes a semiconductor substrate, a plurality of photoelectric conversion portions formed as pixels, for example, on a silicon substrate, CCD-type vertical transfer registers corresponding to individual columns of the photoelectric conversion portions, a CCD-type horizontal transfer register, and an output portion. In addition, the CMOS solid-state imaging device includes a peripheral circuit that composes a signal processing circuit. The pixels each are made of a photoelectric conversion portion and a vertical transfer register corresponding thereto and are regularly two-dimensionally arranged.

Each of the vertical transfer registers is structured by forming a transfer electrode on a transfer channel region of a diffuse layer through a gate insulation film. The horizontal transfer register is disposed at an edge portion of each of the vertical transfer registers and is structured by forming a transfer electrode on a transfer channel region of a diffusion layer through a gate insulation film. The output portion is connected to a floating diffusion portion at the last stage of the horizontal transfer register. A light-shielding film is formed in an area for other than pixels of the imaging region, more specifically, in an area for other than the photoelectric conversion portions of the imaging region and the output portion of the horizontal transfer register. In addition, on-chip color filters are formed on the photoelectric conversion portions through a planarizing film. On the on-chip color filters, on-chip micro-lenses are formed.

In the CCD solid-state imaging device, signal charges generated in the photoelectric conversion portions are read to the vertical transfer registers, transferred in the vertical direction, and signal charges for one line are transferred to the horizontal transfer register. In the horizontal transfer register, the signal charges are transferred in the horizontal direction to the floating diffusion portion connected to the last stage of the horizontal transfer register. The signal charges transferred to the floating diffusion portion are converted into a pixel signal through the output portion. The foregoing CCD solid-state imaging device is an inter-line transfer (IT) type solid-state imaging device. The CCD solid-state imaging device according to an embodiment is applied to a frame interline transfer (FIT) type solid-state imaging device having a storage region made of only vertical transfer registers formed between the imaging region and the horizontal transfer register.

A solid-state imaging device according to an embodiment of the present invention, in particular, the structure of the photoelectric conversion portions, can be applied both to the foregoing CMOS solid-state imaging device and CCD solid-state imaging device. In addition, the structure of the photoelectric conversion portions according to this embodiment can be applied both to a frontside-illuminated solid-state imaging device and a backside-illuminated solid state imaging device.

In a solid-state imaging device according to an embodiment of the present invention, an absorption film that absorbs short-wavelength side light is formed on a photodiode as a photoelectric conversion portion that composes a pixel for desired color light. A photodiode for desired color light is a photodiode for a green pixel that senses green light (also referred to as green light), a photodiode for a red pixel that senses light having the red wavelength range (also referred to as red light), or photodiodes for green and red pixels. Examples of the absorption film that absorbs short-wavelength side light include a silicon film, and a non-single crystal silicon film such as a poly-silicon film or an amorphous silicon film. Examples of the absorption film also include a polycide layer in which a metal silicide film having a high melting point is formed on a polysilicon film and a silicide film in which entire polysilicon is reacted with a metal having a high melting point. Examples of the absorption film also include a structure in which a silicide film reacted with Si, such as Ti silicide, Co silicide, Ni silicide, Pt silicide, or Mo silicide, is partly formed. The film thickness of the absorption film can be controlled and designated according to a desired spectral sensitivity characteristic.

Figure 2A:
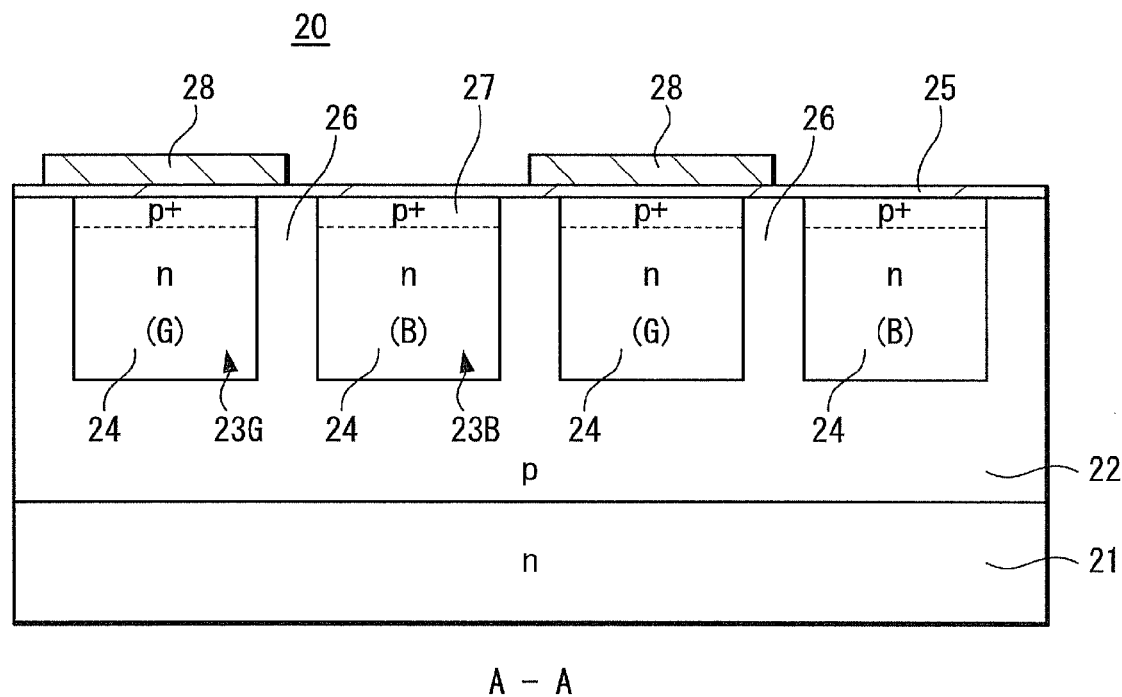
FIG. 2A and FIG. 2B are schematic diagrams showing principal portions of a solid-state imaging device according to a first embodiment of the present invention.
Figure 2B:
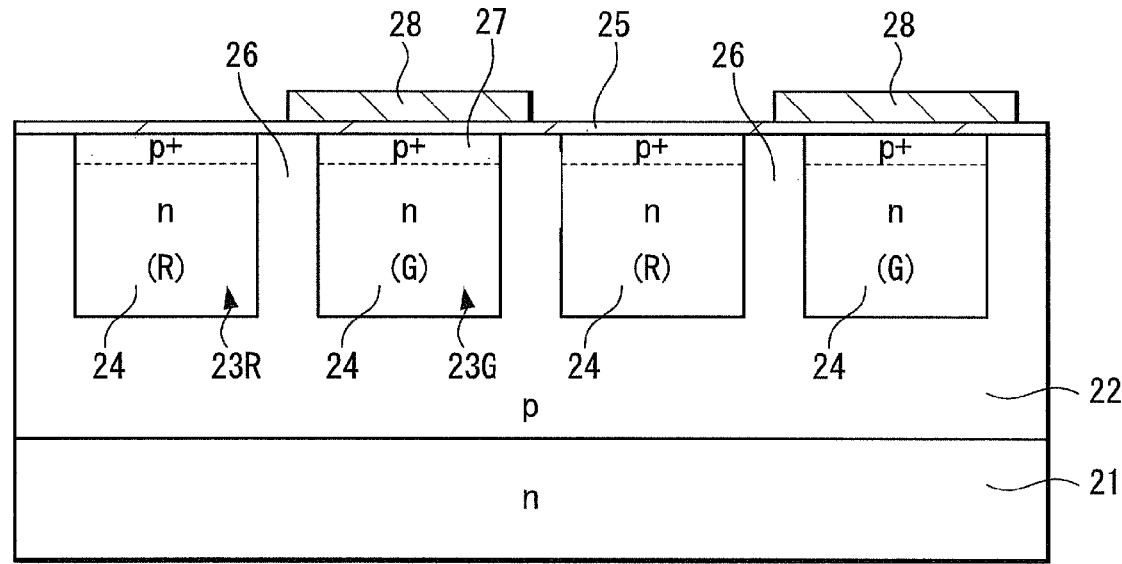
Figure 3:
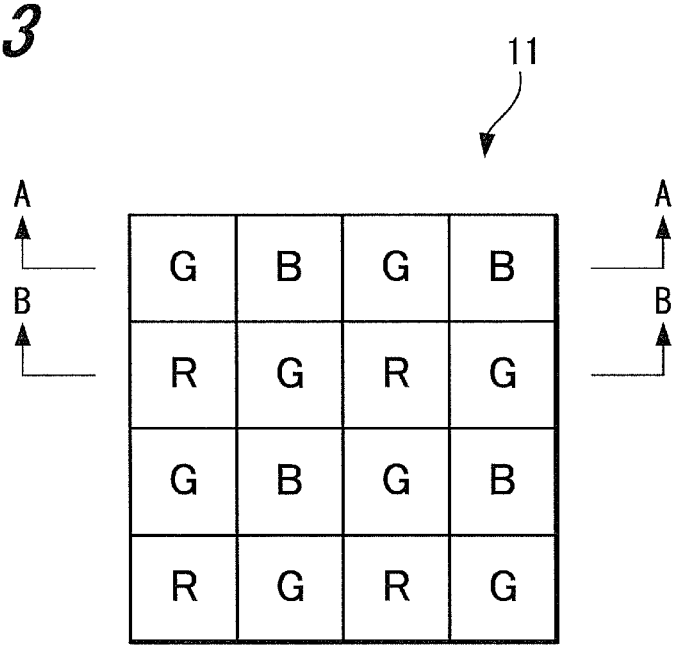
FIG. 3 is a plan view showing an imaging region having Bayer arrangement color filters according to an embodiment of the present invention.

FIG. 2A and FIG. 2B show a solid-state imaging device, in particular, photodiode regions as photoelectric conversion portions, according to a first embodiment of the present invention. FIG. 2A and FIG. 2B schematically show photodiodes for red (R), green (G), and blue (B) pixels. FIG. 2A shows a sectional structure of an imaging region 11 having Bayer arrangement color filters taken along line A-A of FIG. 3. FIG. 2B shows a sectional structure of the imaging region 11 taken along line B-B of FIG. 3.

In a solid-state imaging device 20 according to the first embodiment, a second conductivity-type semiconductor well region 22 is formed on a first conductivity-type silicon semiconductor substrate 21. Photodiodes 23R, 23G, and 23B respectively for red, green, and blue pixels are formed in the semiconductor well region 22. The photodiodes 23R, 23G, and 23B are isolated by device isolation regions 26. In this embodiment, since signal charges are electrons, the silicon semiconductor substrate 21 is made of an n-type semiconductor substrate, whereas the semiconductor well region 22 is made of a p-type semiconductor well region. In addition, the photodiode 23R for the red pixel, the photodiode 23G for the green pixel, and the photodiode 23B for the blue pixel each have an n-type semiconductor region 24. An insulation film 25, for example, a silicon nitride film or a silicon oxide film is formed on the front surface of the substrate including the n-type semiconductor regions 24. A p-type accumulation layer 27 may be formed on the front surface of the n-type semiconductor region 24 of each of the photodiodes 23R to 23B so as to suppress a dirk current from flowing.

In this embodiment, a polysilicon film 28 is formed with a desired film thickness as an absorption film that absorbs short-wavelength side light particularly on the photodiode 23G for the green pixel through the insulation film 25. This polysilicon film 28 is formed with a thickness with which a desired spectral sensitivity characteristic for green is obtained. The polysilicon film 28 absorbs blue light. In this embodiment, the n-type semiconductor regions 24 of the photodiode 23R for the red pixel, the photodiode 23G for the green pixel, and the photodiode 23B for the blue pixel are formed with the same depth. In this embodiment, it is assumed that respective color filters are formed on the photodiodes 23R, 23G, and 23B.

In the solid-state imaging device 20 according to the first embodiment, the polysilicon film 28 is formed with the desired film thickness on the photodiode 23G for the green pixel through the insulation film 25. This polysilicon film 28 absorbs short-wavelength side light of incident green light with a peak sensitivity at a wavelength of 550 nm. Thus, since the short-wavelength side light does not enter the n-type semiconductor region 24 of the photodiode 23G, the spectral sensitivity characteristic for green is represented by a curve (solid line) $2G_2$ shown in FIG. 1. In other words, the float 5 on the short-wavelength side decreases and the cross point with the spectral sensitivity curve 3B for blue decreases to a2. As a result, color mixtures (crosstalk between pixels), so-called color noises, can be decreased in the photodiode 23G without a tradeoff of a decrease of the peak sensitivity.

Figure 4:
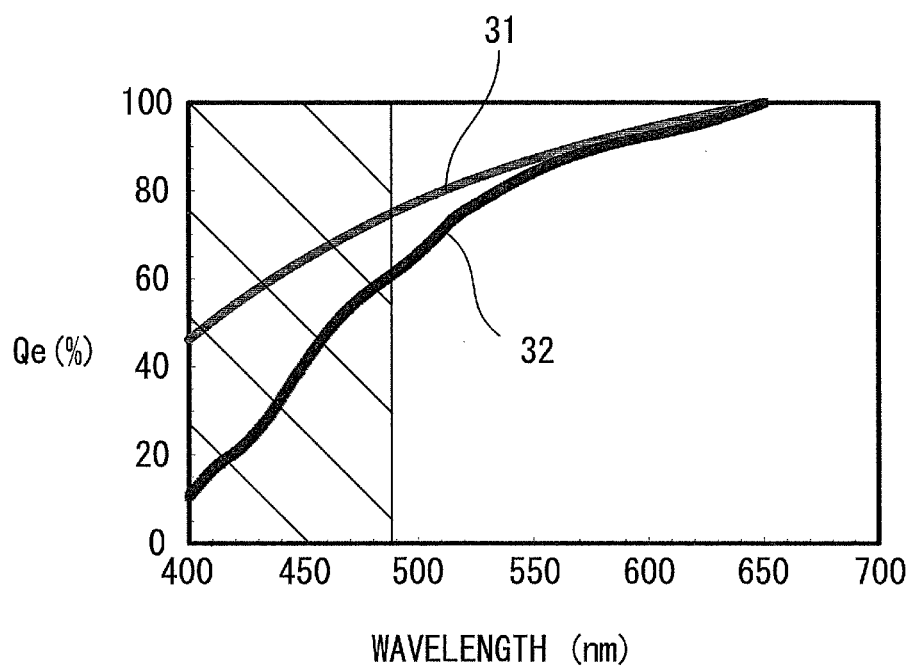
FIG. 4 is a schematic diagram showing a spectral sensitivity characteristic for blue in the cases that a polysilicon film is present or absent according to an embodiment of the present invention.

FIG. 4 shows a difference in sensitivities for blue between the case in which a polysilicon film is not formed on a photodiode and the case in which it is formed. In FIG. 4, the horizontal axis represents wavelengths of light and the vertical axis represents quantum efficiencies (Qe). A curve 31 represents the case in which a polysilicon film is not formed on a photodiode, whereas a curve 32 represents the case in which it is formed. The graph shows that the quantum efficiencies (Qe) decrease in the blue wavelength range of 400 nm to 480 nm, namely the sensitivities for blue decrease. This is because the polysilicon film absorbs blue light.

Figure 5A:
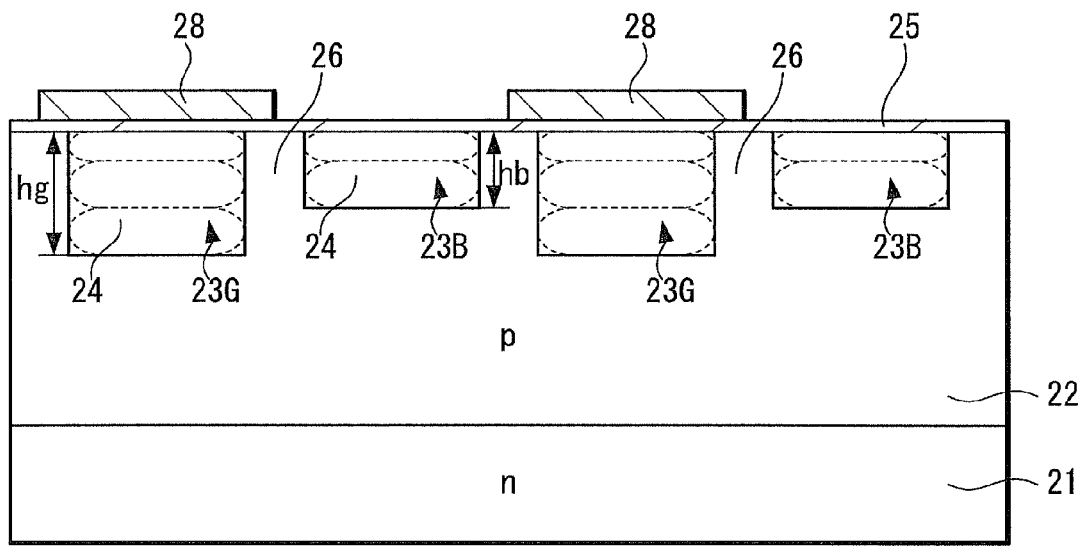
FIG. 5A and FIG. 5B are schematic diagrams showing a structure of principal portions of a solid-state imaging device according to a second embodiment of the present invention.
Figure 5B:
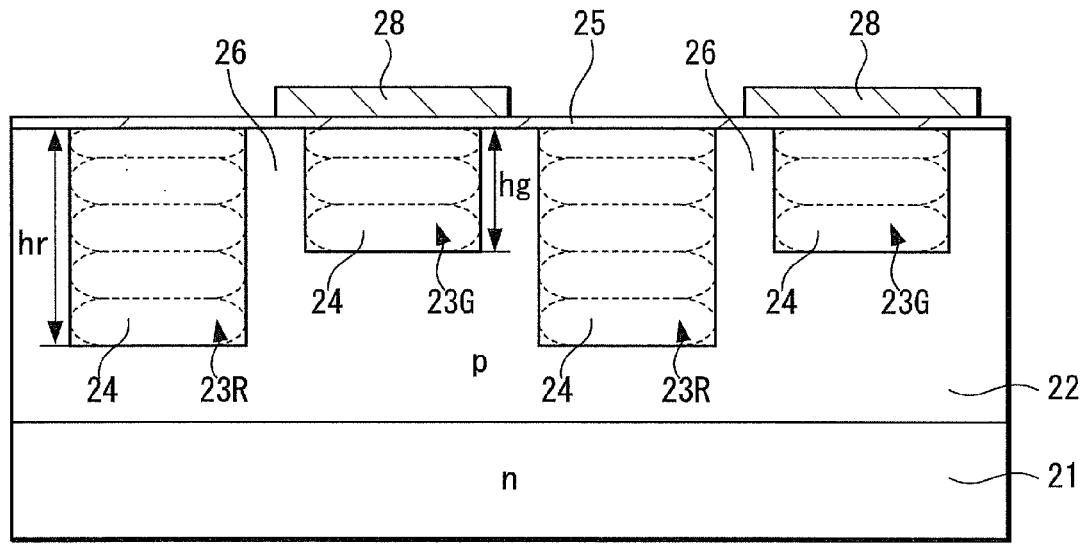

FIG. 5A and FIG. 5B show a solid-state imaging device, in particular, photodiode regions as photoelectric conversion portions, according to a second embodiment of the present invention. FIG. 5A and FIG. 5B schematically show photodiodes for red (R), green (G), and blue (B) pixels like those shown in FIG. 2A and FIG. 2B.

In a solid-state imaging device according to the second embodiment, a polysilicon film 28 is formed with a desired film thickness on a photodiode 23G for a green pixel through an insulation film 25. In addition, n-type semiconductor regions 24 of photodiodes 23R, 23G, and 23B respectively for red, green, and blue pixels are formed with depths corresponding to fundamental absorption coefficients for individual colors, respectively. In other words, the n-type semiconductor region 24 of the photodiode 23R is formed with a fundamental absorption depth hr for red light. The depth hr is the largest. The n-type semiconductor region 24 of the photodiode 23B is formed with a fundamental absorption depth hb for blue light. The depth hb is the smallest. The n-type semiconductor region 24 of the photodiode 23G is formed with a fundamental absorption depth hg for green light. Thus, the depth hg is intermediate of the depth hr and the depth hb. Regions denoted by broken lines in the n-type semiconductor regions 24 represent the numbers of ion injection times. The numbers of ion injection times increase in the order of the photodiodes 23B, 23G, and 23R for blue, green, and red.

The other structures of the solid-state imaging device 34 are the same as those of the solid-state imaging device 20 shown in FIG. 2A and FIG. 2B. In FIG. 5A and FIG. 5B, similar portions are denoted by corresponding reference numerals and their redundant description will be omitted.

In the solid-state imaging device 34 according to the second embodiment, since a polysilicon film 28 is formed on the photodiode 23G for the green pixel, the polysilicon film 28 absorbs short-wavelength side light, resulting in decreasing color mixtures (crosstalk between pixels) of green and blue. In addition, since the photodiode 23G for the green pixel is formed with the fundamental absorption depth for green light, the photodiode 23G for the green pixel does not photoelectrically convert long-wavelength side light. Thus, the cross point of the curve (solid line) $2G_2$ shown in FIG. 1 and the spectral sensitivity curve 1R for red decreases to b2 on the long-wavelength side of the spectral sensitivity characteristic for green, resulting in decreasing color mixtures (crosstalk between pixels) of red and green in the photodiode 23G. In other words, in the second embodiment, the floats 5 and 6 respectively on the short-wavelength side and long-wavelength side can be decreased. As a result, the spectral sensitivity characteristic for green can be further improved and the color mixtures (crosstalk between pixels) can be decreased without a tradeoff of a decrease of the peak sensitivity.

Figure 6:
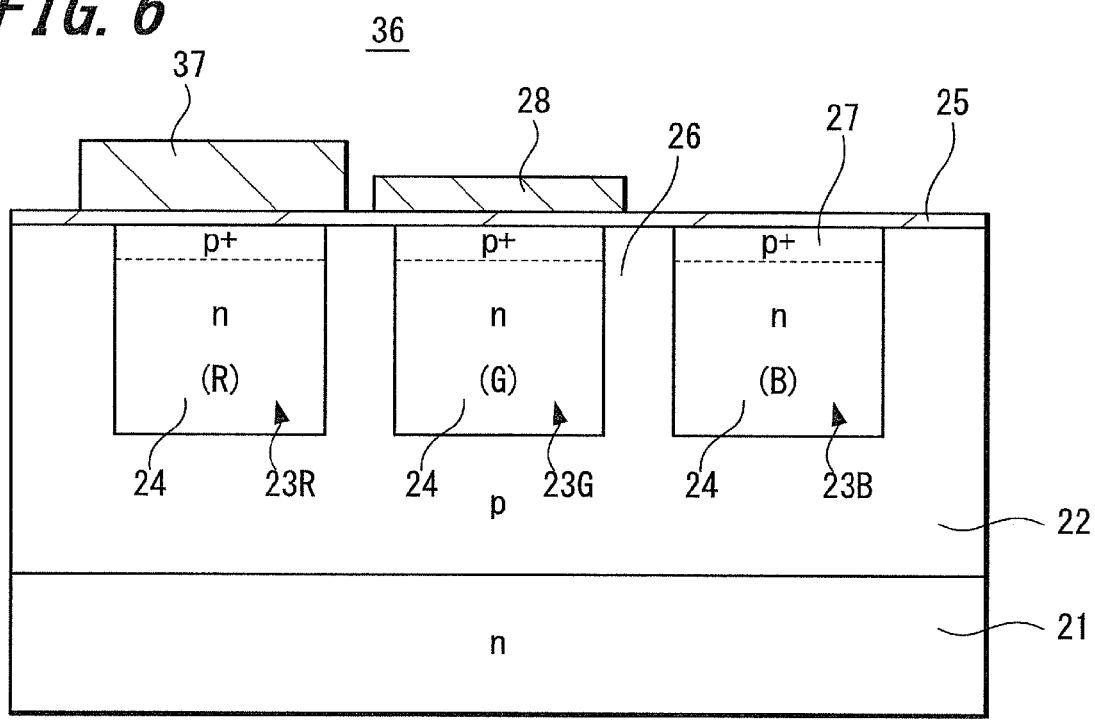
FIG. 6 is a schematic diagram showing a structure of principal portions of a solid-state imaging device according to a third embodiment of the present invention.

FIG. 6 shows a solid-state imaging device, in particular, photodiode regions as photoelectric conversion portions, according to a third embodiment of the present invention. FIG. 6A and FIG. 6B schematically show photodiodes for red (R), green (G), and blue (B) pixels.

In a solid-state imaging device 36 according to the third embodiment, a polysilicon film 28 is formed on a photodiode 23G for a green pixel through an insulation film 25. A polysilicon film 37 is formed with a film thickness larger than that of the polysilicon film 28 on a photodiode 23R for a red pixel through the insulation film 25. As described above, the polysilicon film 28 is formed on the photodiode 23G with a thickness with which the polysilicon film 28 can absorb blue light. The polysilicon film 37 is formed on the photodiode 23R with a thickness with which the polysilicon film 37 can absorb green light. In this embodiment, n-type semiconductor regions 24 of the photodiodes 23R, 23G, and 23B respectively for red, green, and blue pixels are formed with the same depth.

Since the other structures of the solid-state imaging device 36 are the same as those of the solid-state imaging device 20 shown in FIG. 2A and FIG. 2B, similar portions are denoted by corresponding reference numerals and their redundant description will be omitted.

In the solid-state imaging device 36 according to the third embodiment, the polysilicon film 28 formed on the photodiode 23G for the green pixel absorbs blue light. The polysilicon film 37 formed on the photodiode 23R for the red pixel absorbs green light. Thus, in the photodiode 23G for the green pixel and the photodiode 23R for the red pixel, floats of spectral sensitivity characteristics on the short-wavelength side decrease, resulting in decreasing color mixtures (crosstalk between pixels) without a tradeoff of decreases of their peak sensitivities.

Figure 7:
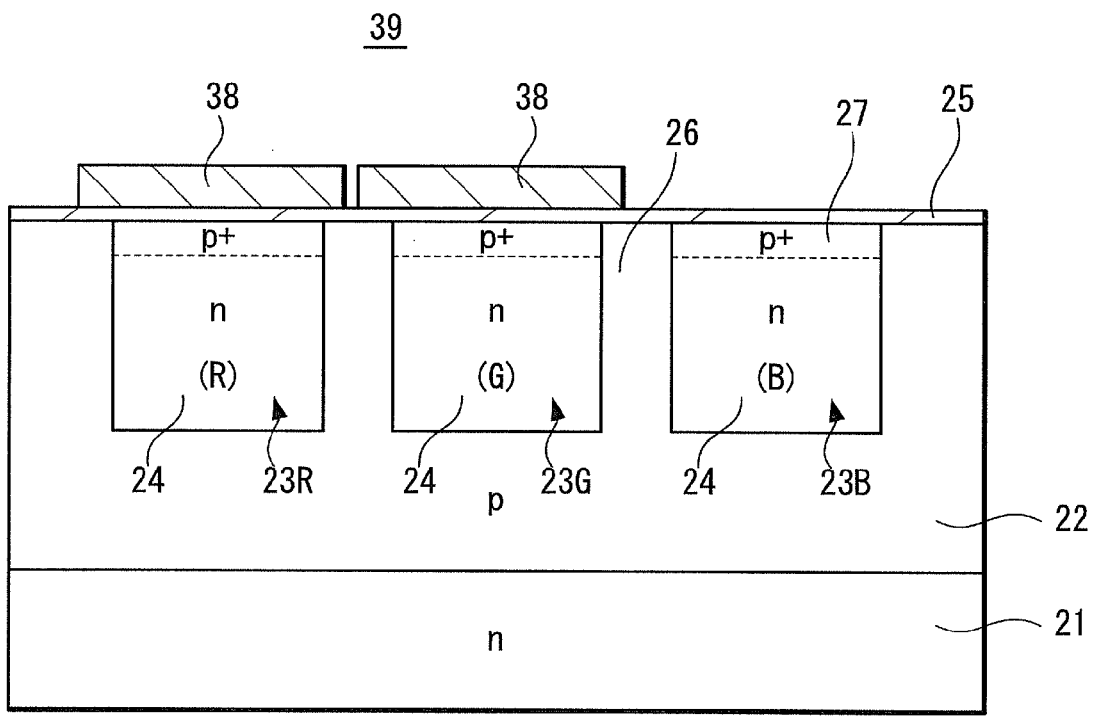
FIG. 7 is a schematic diagram showing a structure of principal portions of a solid-state imaging device according to a fourth embodiment of the present invention.

FIG. 7 shows a solid-state imaging device, in particular, photodiode regions as photoelectric conversion portions, according to a forth embodiment of the present invention. FIG. 7 schematically shows photodiodes for red (R), green (G), and blue (B) pixels like those shown in FIG. 6.

In a solid-state imaging device 39 according to the fourth embodiment, polysilicon films 38 are formed with the same thickness on a photodiode 23G for a green pixel and a photodiode 23R for a red pixel through an insulation film 25. The polysilicon films 38 can be formed with a thickness corresponding to desired spectral sensitivity characteristics. The polysilicon films 38 may be formed with the same thickness as that of the foregoing polysilicon film 28.

Since the other structures of the solid-state imaging device 39 are the same as those of the solid-state imaging devices 20 and 36 shown in FIG. 2A and FIG. 2B and FIG. 6, similar portions are denoted by corresponding reference numerals and their redundant description will be omitted.

In the solid-state imaging device 39 according to the fourth embodiment, the polysilicon films 38 with the same desired film thickness formed on the photodiode 23R for the red pixel and the photodiode 23G for the green pixel can decrease color mixtures (crosstalk between pixels) in the photodiodes 23R and 23G without a tradeoff of decreases of their peak sensitivities.

Figure 8:
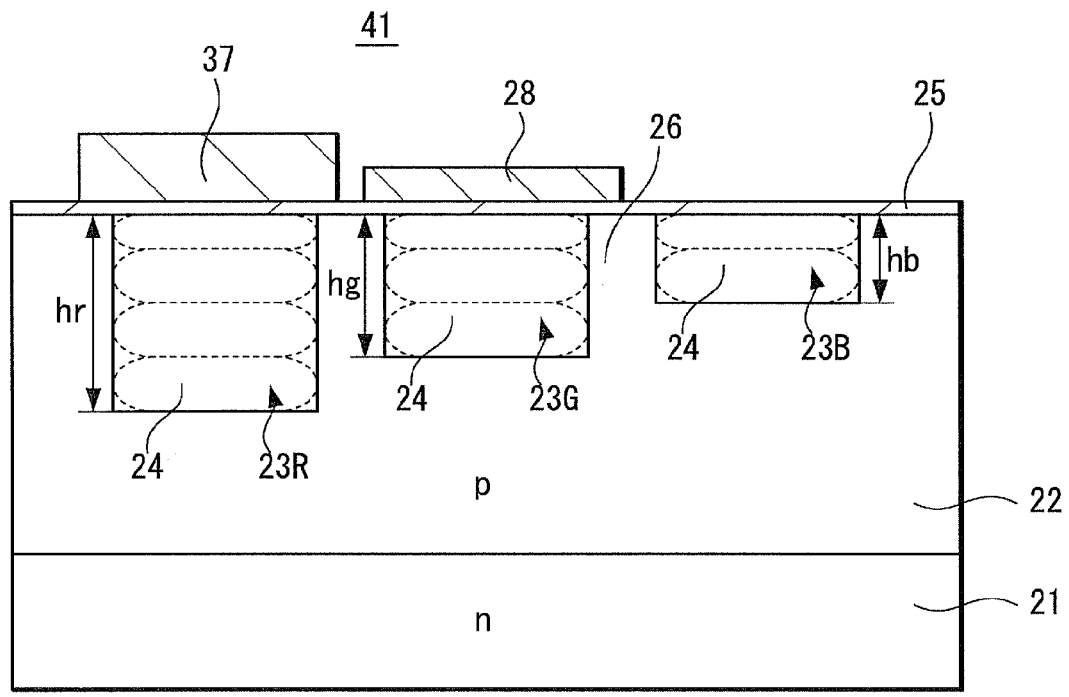
FIG. 8 is a schematic diagram showing a structure of principal portions of a solid-state imaging device according to a fifth embodiment of the present invention.

FIG. 8 shows a solid-state imaging device, in particular, photodiode regions as photoelectric conversion portions, according to a fifth embodiment of the present invention. FIG. 8 schematically shows photodiodes for red (R), green (G), and blue (B) pixels like those shown in FIG. 6.

Like in the solid-state imaging device 36 shown in FIG. 6, in a solid-state imaging device 41 according to the fifth embodiment, polysilicon films 28 and 37 are formed with different film thicknesses on a photodiodes 23G and 23R respectively for green and red pixels through an insulation film 25. In addition, as described with reference to FIG. 5A and FIG. 5B, n-type semiconductor regions 24 of the photodiode 23R for the red pixel, the photodiode 23G for the green pixel, and the photodiode 23B for the blue pixel are formed with different depths corresponding to fundamental absorption coefficients for individual colors, respectively. In other words, the n-type semiconductor region 24 of the photodiode 23R is formed with a depth hr that is the largest. The n-type semiconductor region 24 of the photodiode 23B is formed with a depth hb that is the smallest. The n-type semiconductor region 24 of the photodiode 23G is formed with a depth hg that is an intermediate of the depth hr and the depth hb. Regions denoted by broken lines in the n-type semiconductor regions 24 represent the numbers of ion injection times. The numbers of ion injection times increase in the order of the photodiodes 23B, 23G, and 23R respectively for blue, green, and red pixels.

Since the other structures of the solid-state imaging device 41 are the same as those of the solid-state imaging devices 20, 34, and 36 shown in FIG. 2A and FIG. 2B, FIG. 5A and FIG. 5B, and FIG. 6, respectively, similar portions are denoted by corresponding reference numerals and their redundant description will be omitted.

In the solid-state imaging device 41 according to the fifth embodiment, as described above, floats 5 and 6 on the short-wavelength side and long-wavelength side of the spectral sensitivity characteristic for green in the photodiode 23G for the green pixel decrease, resulting in decreasing color mixtures (crosstalk between pixels) without a tradeoff of a decrease of the peak sensitivity. On the other hand, a float on the short-wavelength side of the spectral sensitivity characteristic for red light in the photodiode 23R for the red pixel decreases, resulting in decreasing color mixtures (crosstalk between pixels) without a tradeoff a decrease of the peak sensitivity.

Figure 9:
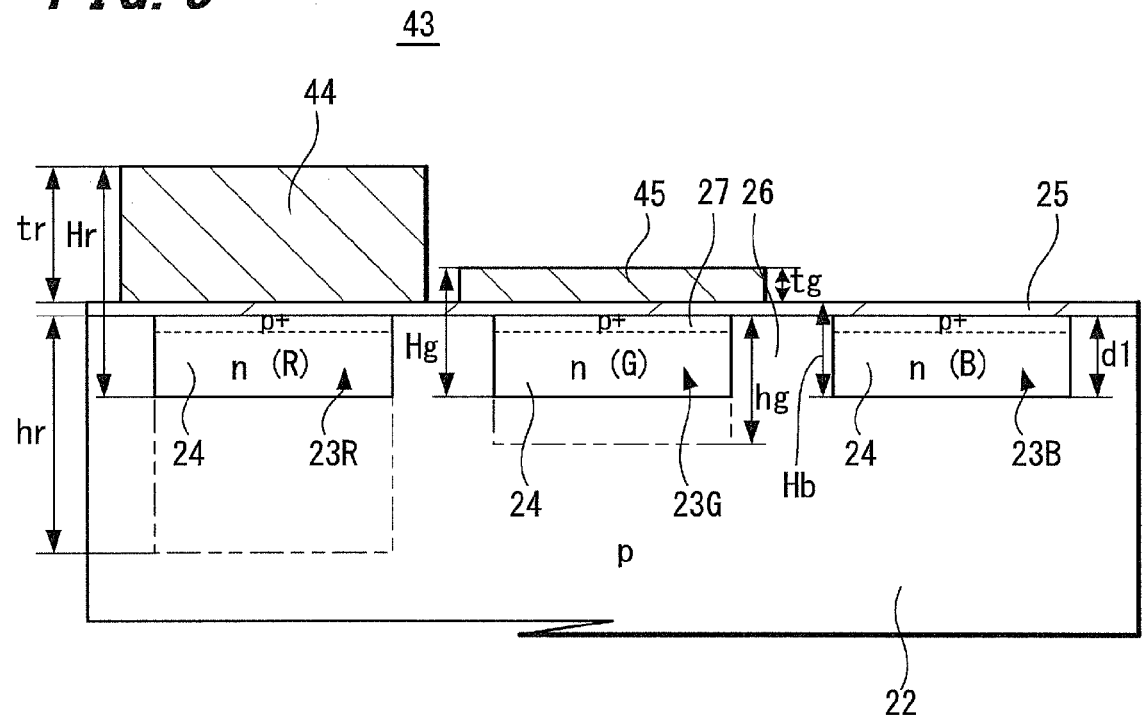
FIG. 9 is a schematic diagram showing a structure of principal portions of a solid-state imaging device according to a sixth embodiment of the present invention.

FIG. 9 shows a solid-state imaging device, in particular, photodiode regions as photoelectric conversion portions, according to a sixth embodiment of the present invention. FIG. 9 schematically shows photodiodes for red (R), green (G), and blue (B) pixels.

In a solid-state imaging device 43 according to the sixth embodiment, n-type semiconductor regions 24 of photodiodes 23R, 23G, and 23B respectively for red, green, and blue pixels each are formed with a depth d1 of the n-type semiconductor region of the photodiode for the blue pixel. In addition, a polysilicon film 44 is formed on the photodiode 23R for the red pixel through an insulation film 25. Moreover, a polysilicon film 45 is formed on the photodiode 23G for the green pixel through the insulation film 25. The polysilicon film 44 is formed on the photodiode 23R for the red pixel with a film thickness tr that is the same as a fundamental absorption depth hr for red light as described with reference to FIG. 5A and FIG. 5B. Likewise, the polysilicon film 45 is formed on the photodiode 23G for the green pixel with a film thickness tg such that the total thickness of the polysilicon film 45 and the n-type semiconductor regions 24 becomes the same as a fundamental absorption depth hg for red light as described with reference to FIG. 5A and FIG. 5B.

Since the other structures of the solid-state imaging device 43 are the same as those of the solid-state imaging device 20 shown in FIG. 2A and FIG. 2B, similar portions are denoted by corresponding reference numerals and their redundant description will be omitted.

In the solid-state imaging device 43 according to the sixth embodiment, the n-type semiconductor regions 24 of the pixel photodiodes 23R, 23G, and 23B for individual color pixels are formed with a depth, d1 of the n-type semiconductor region 24 of the photodiode 23B for the green pixel. In addition, the polysilicon film 44 and the polysilicon film 45 are formed with thicknesses tr and tg such that the total thicknesses Hr, Hg, and Hb become the same as the fundamental absorption depths hr, hg, and hb, respectively. In this structure, the polysilicon film 44 of the photodiode 23R for the red pixel absorbs blue light and green light and thereby only red light enters the n-type semiconductor region 24. Thus, the n-type semiconductor region 24 of the red pixel converts red light into electricity. The polysilicon film 45 of the photodiode 23G for the green pixel absorbs blue light and thereby only green light enters the n-type semiconductor region 24. The n-type semiconductor region 24 photoelectrically converts green light into electricity. Only blue light enters the n-type semiconductor region 24 of the photodiode 23B for the blue pixel and the n-type semiconductor regions 24 converts the blue light into electricity.

Thus, particularly in the pixel photodiodes 23R and 23G respectively for red and green pixels, color mixtures (crosstalk between pixels) are suppressed and thereby spectral sensitivity characteristics for red, green, and blue are improved. Moreover, in this structure, color filters can be omitted.

In addition, since the n-type semiconductor regions 24 of the photodiodes 23R, 23G, and 23B are formed with a shallow depth corresponding to the fundamental absorption coefficient for blue, even if pixels are miniaturized, n-type semiconductor regions 24 can be formed with high accuracies. In this connection, when pixels are miniaturized, it becomes difficult to deeply inject ions into the silicon substrate 22. For example, in this case, since lateral diffusions occur in a deep area, there is a risk of which adjacent pixels contact. In addition, an ion injection resist mask may fall down, resulting in becoming difficult to deeply inject ions into silicon substrate 22. In contrast, according to this embodiment, since ions can be shallowly injected into the silicon substrate 22, this embodiment is suitable to miniaturize pixels.

Figure 10:
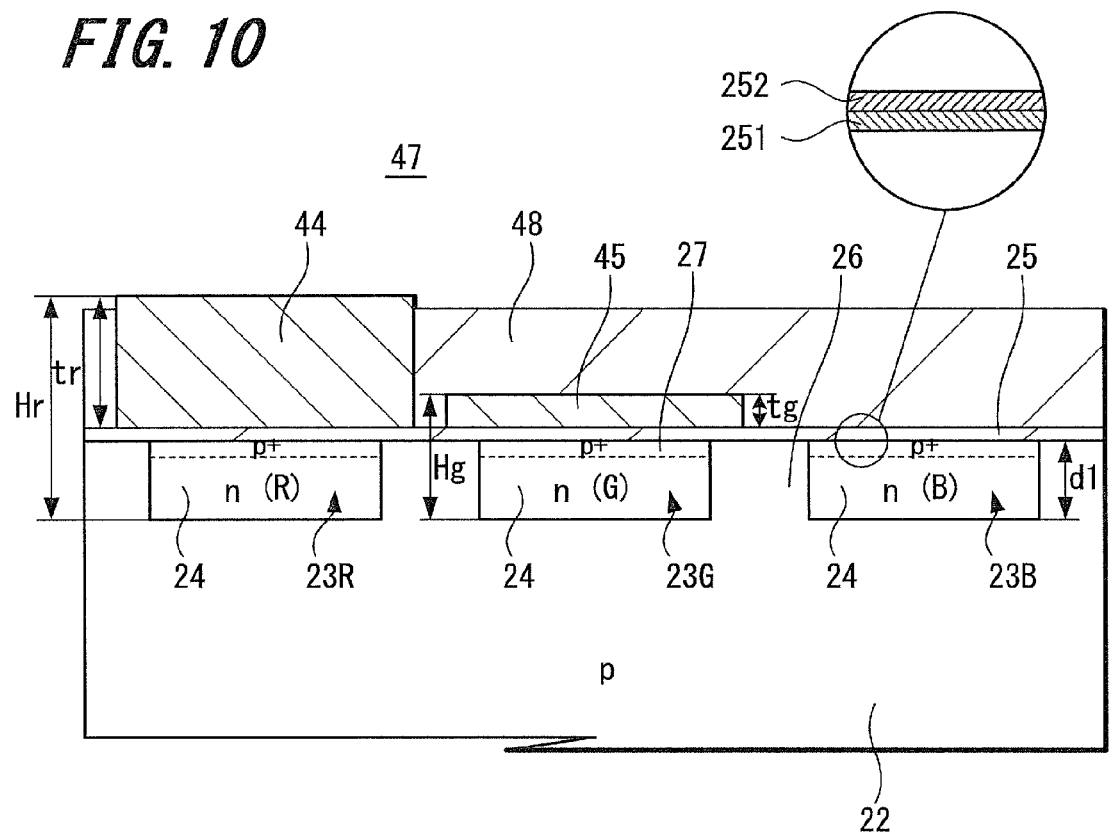
FIG. 10 is a schematic diagram showing a structure of principal portions of a solid-state imaging device according to a seventh embodiment of the present invention.

FIG. 10 shows a solid-state imaging device, in particular, photodiode regions as photoelectric conversion portions, according to a seventh embodiment of the present invention.

FIG. 10 schematically shows photodiodes for red (R), green (G), and blue (B) pixels like those shown in FIG. 9.

Like in the solid-state imaging device 43 shown in FIG. 9, in a solid-state imaging device 47 according to the seventh embodiment, n-type semiconductor regions 24 of photodiodes 23R, 23G, and 23B respectively for red, green, and blue pixels each are formed with a depth d1 of the n-type semiconductor region 24 of the photodiode 23B for the blue pixel. In addition, a polysilicon film 44 is formed on the photodiode 23R for the red pixel through an insulation film 25. Moreover, a polysilicon film 45 is formed on the photodiode 23G for the green pixel through the insulation film 25. The polysilicon film 44 is formed on the photodiode 23R for the red pixel such that a height Hr of a total of the polysilicon film 44 and the n-type semiconductor region 24 becomes the same as the fundamental absorption depth hr for red light as described with reference to FIG. 5A and FIG. 5B. Likewise, the polysilicon film 45 is formed on the photodiode 23G for the green pixel such that a height Hg of a total of the polysilicon film 45 and the n-type semiconductor regions 24 becomes the same as a fundamental absorption depth hg for green light as described with reference to FIG. 5A and FIG. 5B.

In this embodiment, an insulation film 48 is formed with a desired film thickness on the substrate such that at least an upper surface of the polysilicon film 44 formed on the photodiode 23R for the red pixel is exposed. The insulation film 48 is a film having a smaller refractive index than that of the polysilicon film 44 as an absorption film. Examples of the material of the insulation film 48 include a silicon oxide film and a silicon nitride film. The refractive index of the polysilicon film 44 is around 4.2. The refractive index of a silicon oxide film is around 1.46. The refractive index of a silicon nitride film is around 2.0. The insulation film 48 can be formed such that an upper portion of the polysilicon film 44 extends. Instead, the insulation film 48 may be formed such that the upper surface of the insulation film 48 matches the upper surface of the polysilicon film 44.

Since the other structures of the solid-state imaging device 47 are the same as those of the solid-state imaging device 43 shown in FIG. 9, similar portions are denoted by corresponding reference numerals and their redundant description will be omitted.

In the solid-state imaging device 47 according to the seventh embodiment, the n-type semiconductor regions 24 of the photodiodes 23R, 23G, and 23B for the red, green, and blue pixels are shallowly formed such that the polysilicon films 44 and 45 are formed with the desired film thicknesses tr and tg, respectively. In the polysilicon films 44 and 45, the fundamental absorptions for blue light and green light and the fundamental absorption for blue light occur, respectively. Thus, as described in the sixth embodiment, particularly, in the pixel photodiodes 23R and 23G for the red and green pixels, color mixtures (crosstalk between pixels) are suppressed and thereby spectral sensitivity characteristics for red, green, and blue are improved. Moreover, in this structure, color filters can be omitted. In addition, even if pixels are miniaturized, the photodiodes 23R, 23G, and 23B can be accurately formed.

In the seventh embodiment, the insulation film 48 is formed around the red pixel polysilicon film 44. In this structure, since the refractive index of the insulation film 48 is smaller than that of the red pixel polysilicon film 44, light that enters the polysilicon film 44 is totally reflected at an interface between the polysilicon film 44 and the insulation film 48 and irradiated to the photodiode 23R for the red pixel.

The insulation film 25 may be a reflection protection film having a two-layer structure of a silicon oxide film 251 and a silicon nitride film 252. This reflection protection film structure can be applied to any of embodiments of the present invention.

Figure 11:
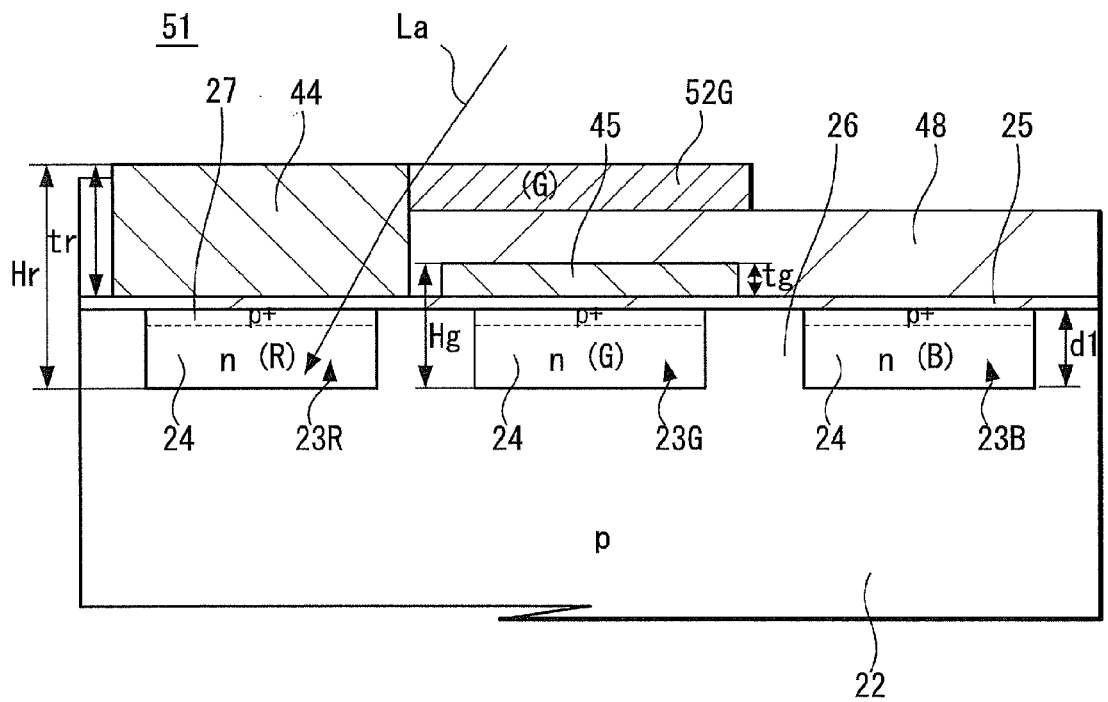
FIG. 11 is a schematic diagram showing a structure of principal portions of a solid-state imaging device according to an eighth embodiment of the present invention.

FIG. 11 shows a solid-state imaging device, in particular, photodiode regions as photoelectric conversion portions, according to an eighth embodiment of the present invention. FIG. 11 schematically shows photodiodes for red (R), green (G), and blue (B) pixels like those shown in FIG. 9.

Like in the solid-state imaging device 47 shown in FIG. 10, in a solid-state imaging device 51 according to the eighth embodiment, n-type semiconductor regions 24 of photodiodes 23R, 23G, and 23B respectively for red, green, and blue pixels each are formed with a depth d1 of the n-type semiconductor region of the pixel photodiode 23B for the blue pixel. In addition, a polysilicon film 44 is formed with a film thickness tr on the photodiode 23R for the red pixel through an insulation film 25. Moreover, a polysilicon film 45 is formed with a film thickness tg on the photodiode 23G for the green pixel through the insulation film 25.

In addition, in this embodiment, an insulation film 48 is formed on the entire substrate except for the upper portion of the polysilicon film 44 for the red pixel. A green filter 52G is formed on the insulation film 48 corresponding to the polysilicon film 45 for the green pixel.

In the solid-state imaging device 51 according to the eighth embodiment, even if oblique light La transmits through an adjacent green filter 52G for the green pixel and enters the photodiode 23R for the red pixel through the polysilicon film 44, the oblique light La does not affect the photodiode 23R for the red pixel. In other words, after the oblique light La transmits through the green filter 52G, the oblique light La becomes green light. The green light is absorbed by the polysilicon film 44. Thus, the oblique light La that passes through an adjacent pixel does not cause color mixtures (crosstalk between pixels) in the photodiode 23R for the red pixel. In addition, the eighth embodiment has the same effects as those of the seventh embodiment.

In the eighth embodiment, a green filter is formed only for the green pixel, not for the red and blue pixels. In addition, on-chip microlenses can be omitted.

The solid-state imaging devices according to the seventh embodiment and the eighth embodiment can be applied to backside-illuminated CMOS solid-state imaging devices. As a result, backside-illuminated solid-state imaging devices free of color mixtures (crosstalk between pixels) can be obtained.

FIG. 12A to FIG. 12C and FIG. 13A to FIG. 13C show absorption films on photodiodes for red and green pixels according to modifications of the foregoing embodiments of the present invention. These modifications can be applied to embodiments that follow.

Figure 12A:
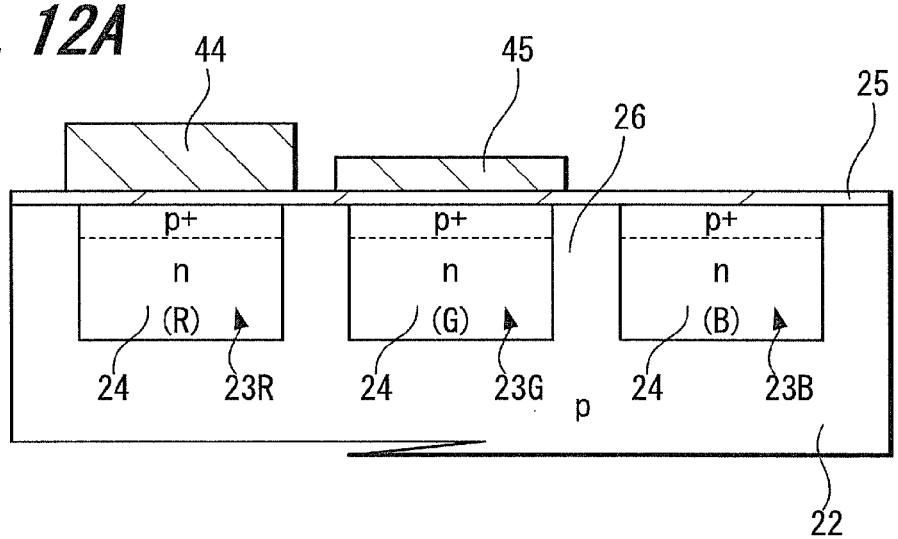
FIG. 12A, FIG. 12B, and FIG. 12C are schematic diagrams showing structures of principal portions of modifications of embodiments of the present invention.

FIG. 12A shows an example of a structure in which absorption films made of polysilicon films 44 and 45 are formed with different film thicknesses on photodiodes 23R and 23G for red and green pixels, respectively.

Figure 12B:
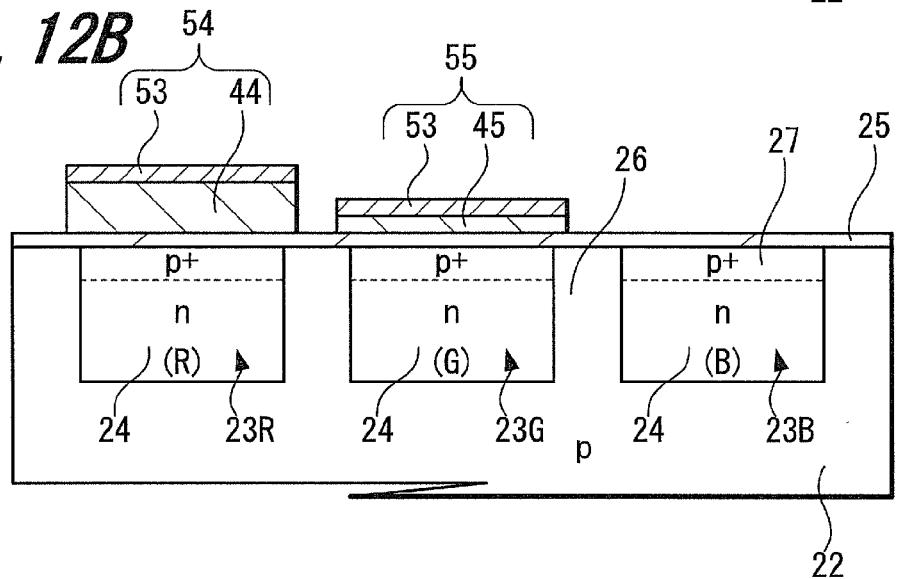

FIG. 12B shows an example of a structure in which absorption films made of polysilicon films 44 and 45 having different film thicknesses and polycide layers 54 and 55 made of a metal silicide film 53 having a high melting point are formed on the photodiodes 23R and 23G for red and green pixels, respectively.

Figure 12C:
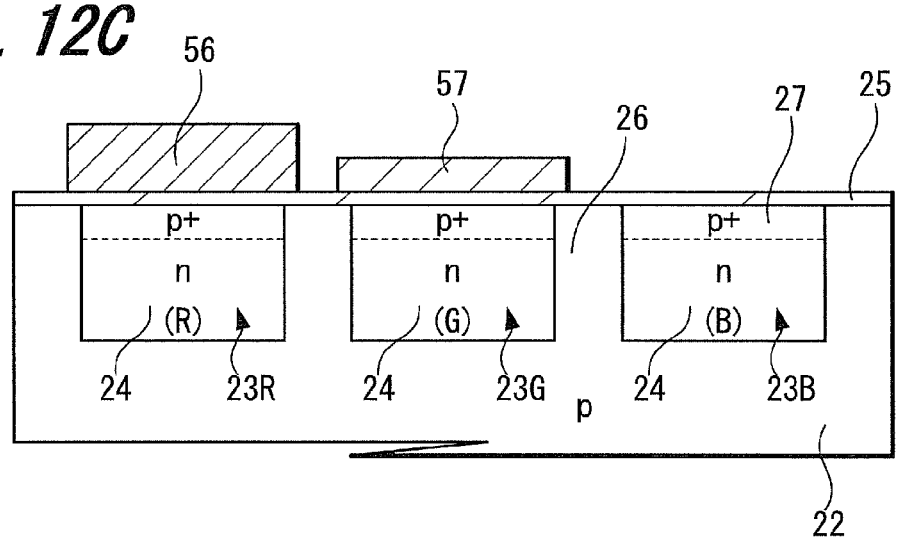

FIG. 12C shows an example of a structure in which absorption films of silicide films 56 and 57 obtained by reacting whole polysilicon films having different film thicknesses with a metal having a high melting point are formed on photodiodes 23R and 23G for red and green pixels, respectively.

The metal silicide films having a high melting point have higher light absorptivity than that of the polysilicon films.

FIG. 13A shows an example of a structure in which an absorption film made of a polysilicon film 45 is formed with a desired film thickness only on a photodiode 23G for a green pixel.

FIG. 13B shows an example of a structure in which an absorption film of a polycide layer 55 made of a polysilicon film 45 having a desired film thickness and a metal silicide film 53 as an upper layer of the polysilicon film 45 is formed only on a photodiode 23G for a green pixel.

FIG. 13C shows an example of a structure in which an absorption film of a silicide film 57 made by reacting a whole polysilicon film having a desired film thickness with a metal having a high-melting point is formed only on a photodiode 23G for a green pixel.

Figure 14A:
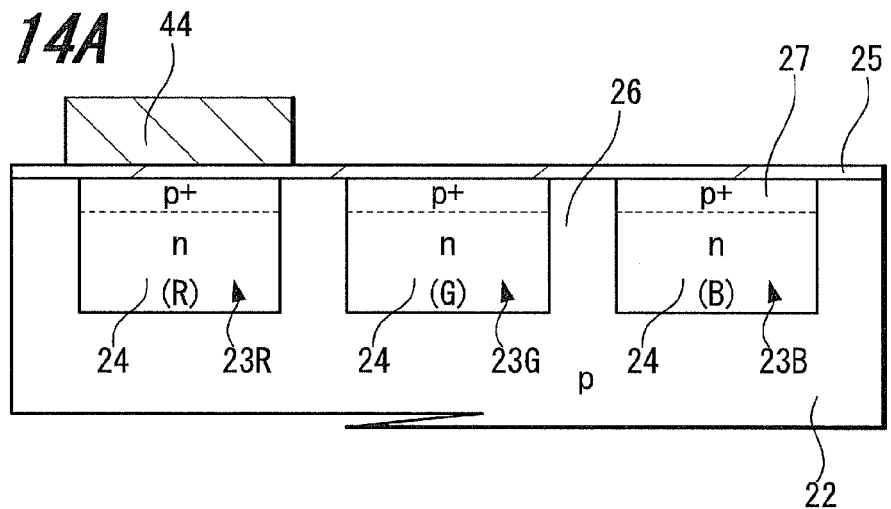
FIG. 14A, FIG. 14B, and FIG. 14C are schematic diagrams showing structures of principal portions of modifications of embodiments of the present invention.

FIG. 14A shows an example of a structure in which an absorption film made of a polysilicon film 44 is formed with a desired film thickness only on a photodiode 23R for a red pixel.

Figure 14B:
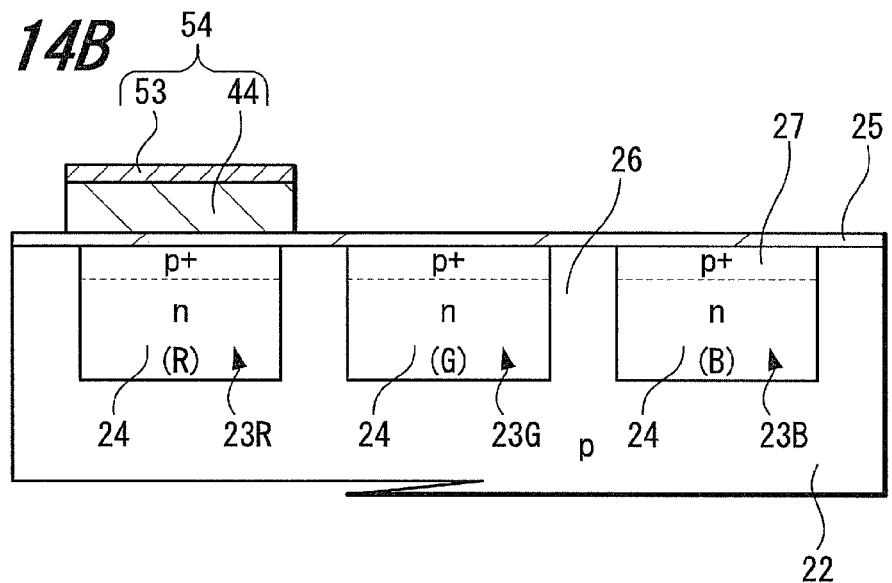

FIG. 14B shows an example of a structure in which an absorption film of a polycide layer 54 made of a polysilicon film 44 having a desired film thickness and a metal silicide film 53 having a high melting point as an upper layer of the polysilicon film 44 is formed only on a photodiode 23R for a red pixel.

Figure 14C:
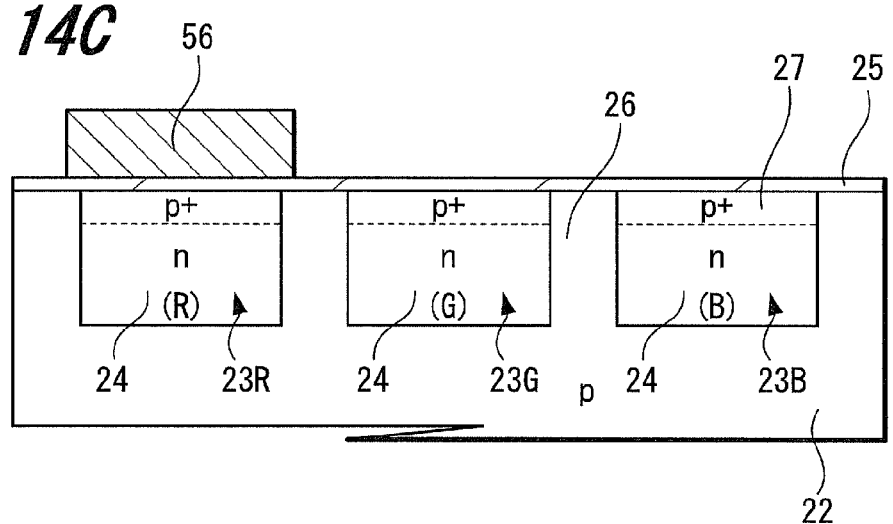

FIG. 14C shows an example of a structure in which an absorption film of a silicide film 56 made by reacting a whole polysilicon film having a desired film thickness with a metal having a high melting point is formed only on a photodiode 23R for a red pixel.

As the absorption film, an amorphous silicon film may be used instead of the foregoing polysilicon film. When the solid-state imaging devices according to these modifications are applied to CMOS solid-state imaging devices, a plurality of Cu wiring layers may be used. When the solid-state imaging devices according to these modifications are applied to back-illuminated CMOS solid-state imaging devices, after a plurality of wiring layers are formed, an absorption film is formed. Thus, it is preferred to use an amorphous silicon film as the absorption film.

When a polysilicon film is used for the absorption film, it is preferred to use a p-type polysilicon film. When a p-type polysilicon film is used, it allows holes to be kept in a so-called pinning state on the front surface of the n-type semiconductor surface without a p-type accumulation layer 27 formed on the front surface of an n-type semiconductor region 24 of a photodiode, resulting in suppressing white dots from occurring.

Figure 15:
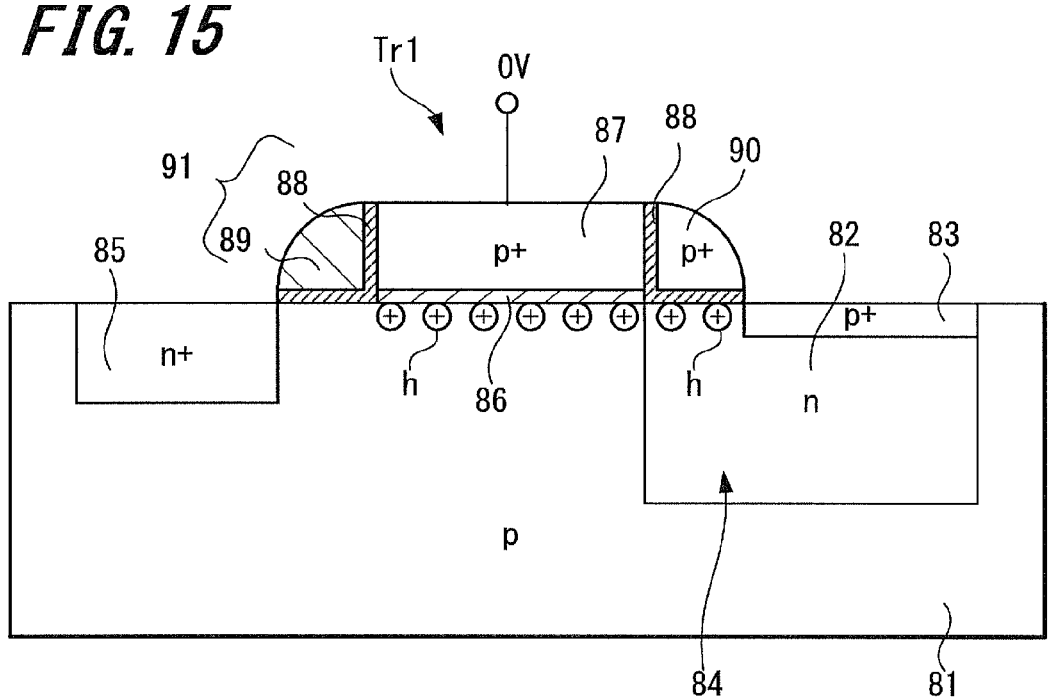
FIG. 15 is a sectional view showing a structure of principal portions of an example of a solid-state imaging device according to an embodiment of the present invention.

FIG. 15 shows an example of a structure of a CMOS solid-state imaging device. In this CMOS solid-state imaging device, a photodiode 84 made of an n-type semiconductor region 82 and a p-type accumulation layer 83 is formed in a p-type semiconductor region 81. In addition, a floating diffusion portion 85 of an n-type semiconductor region is formed in the p-type semiconductor region 81. A transfer gate electrode 87 is formed between the photodiode 84 and the floating diffusion portion 85 through a gate insulation layer 86. As a result, a transfer transistor Tr1 is formed as one pixel transistor. At this point, the transfer gate electrode 87 is made of a poly-silicon film, for example, p-type polysilicon and a sidewall 90 made of p-type polysilicon (hereinafter, the sidewall 90 is referred to as the p+ poly-sidewall 90) is formed through an insulation layer, for example, a silicon oxide film 88 on the photodiode 84 side. An insulation side wall 91 having a two-layer structure of a silicon oxide film 88 and a silicon nitride film 89 is formed on the floating diffusion portion 85 side. However, the p-type accumulation layer 83 is not formed on the front surface of the n-type semiconductor region 82 immediately below the p+ poly-sidewall 90.

In this solid-state imaging device, a voltage of 0 V is applied to the transfer gate electrode 87 in a charge accumulation period. This voltage of 0 V is applied to the p+ poly-sidewall 90 through a coupling capacitor. Holes h are induced immediately below the transfer gate electrode 87 and the p+ poly-sidewall 90 and the holes are kept in the pinning state. Thus, white spots can be suppressed from occurring.

The foregoing polysilicon films 28, 37, 38, 44, and 45 can be formed using p-type polysilicon of the p+ poly-sidewall 90. In addition, the polysilicon films 28, 37, 38, 44, and 45 can be formed using p-type polysilicon of the transfer gate electrode 87.

Figure 16:
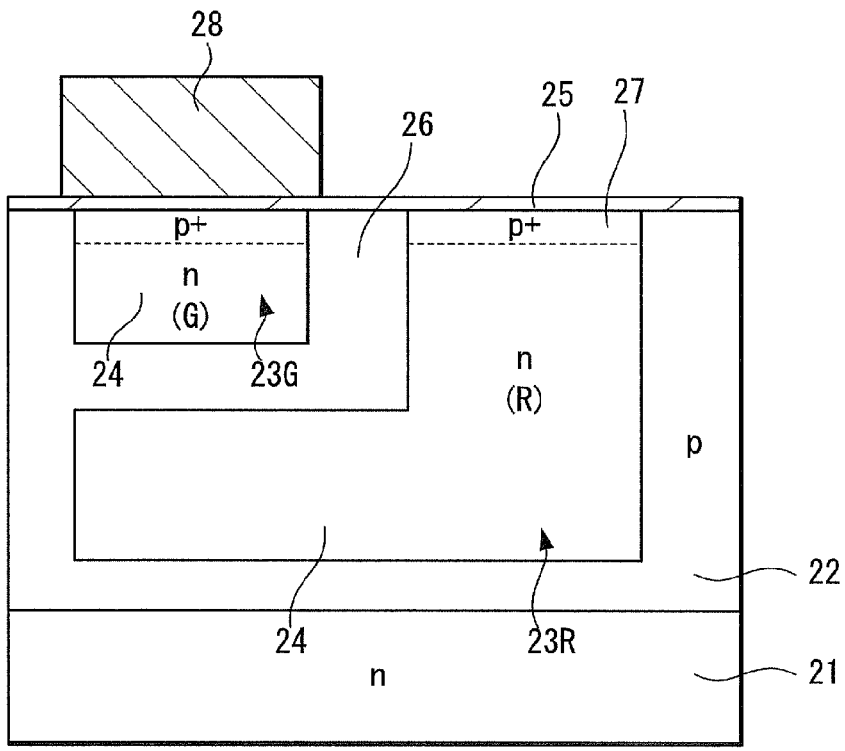
FIG. 16 is a schematic diagram showing a structure of principal portions of a solid-state imaging device according to a ninth embodiment of the present invention.

FIG. 16 shows a solid-state imaging device, in particular, photodiode regions as photoelectric conversion portions, according to a ninth embodiment of the present invention. FIG. 16 schematically shows photodiodes for red, green, and blue pixels.

In a solid-state imaging device 54 according to the ninth embodiment, n-type semiconductor regions 24 of photodiodes 23R, 23G, and 23B (not shown) for red, green, and blue pixels are formed with depths with which the fundamental absorptions for red light, green light, and blue light occur, respectively. In other words, the depths of the n-type semiconductor regions 24 differ in red, green, and blue pixels. In this embodiment, a polysilicon film 28 that absorbs short-wavelength side light (namely, blue light) is formed only on the photodiode 23G for the green pixel through an insulation film 25.

In this embodiment, since the n-type semiconductor region 24 of the photodiode 23G for the green pixel is shallower than the n-type semiconductor region 24 of the pixel photodiode 23R for the red pixel, the n-type semiconductor region 24 for the red pixel partly extends immediately below the n-type semiconductor region 24 for the green pixel. Since the other structures of the solid-state imaging device 54 according to the ninth embodiment are the same as those of the first embodiment shown in FIG. 2A and FIG. 2B, similar portions are denoted by corresponding reference numerals and their redundant description will be omitted.

In the solid-state imaging device 54 according to the ninth embodiment, as described above, the polysilicon film 28 can improve the spectral sensitivity characteristic for green. Likewise, since the n-type semiconductor region 24 for the red pixel extends immediately below the n-type semiconductor region 24 for the green pixel, the area of the photodiode 23R for the red pixel increases, resulting in improvement of the sensitivity of the red pixel.

Figure 17:
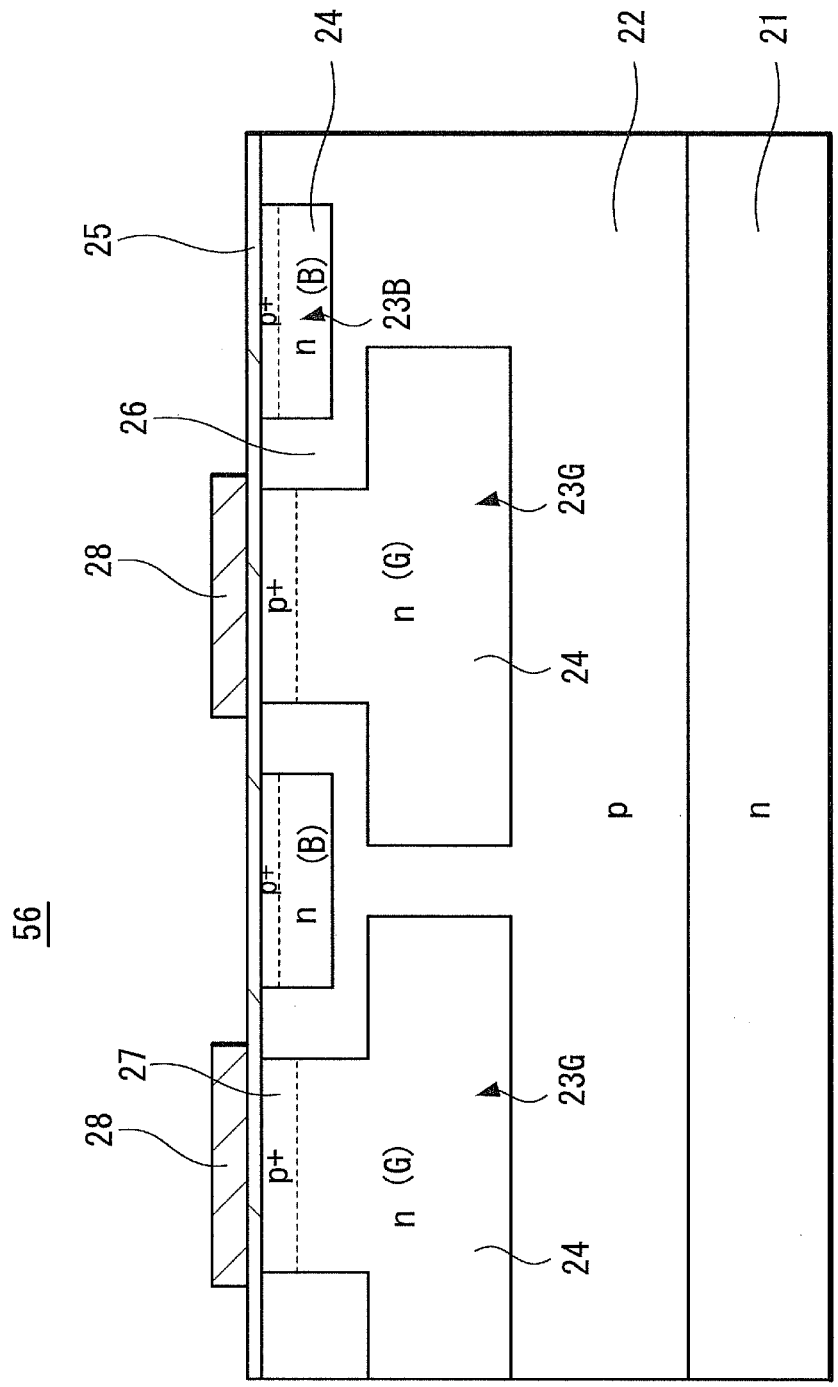
FIG. 17 is a schematic diagram showing a structure of principal portions of a solid-state imaging device according to a tenth embodiment of the present invention.
Figure 18:
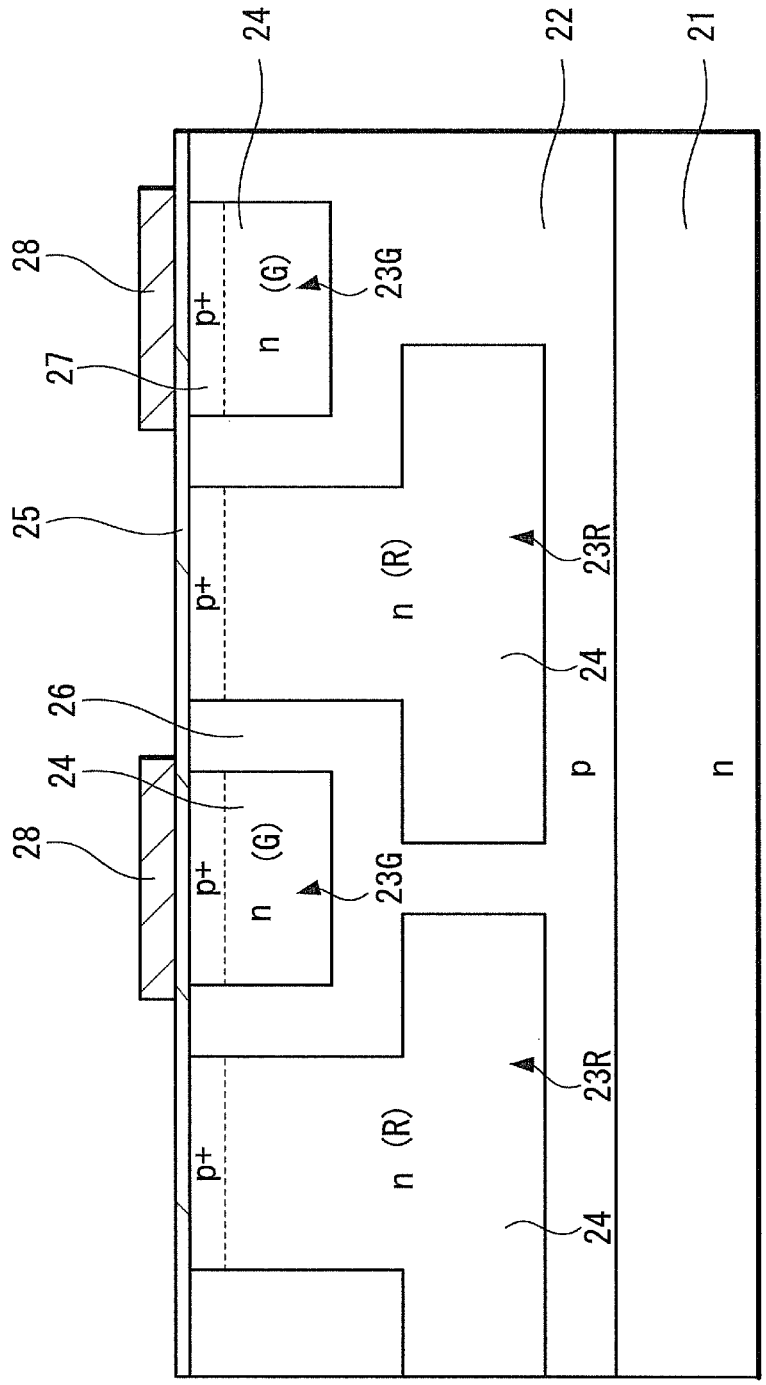
FIG. 18 is a schematic diagram showing a structure of principal portions of a solid-state imaging device according to the tenth embodiment of the present invention.

FIG. 17 and FIG. 18 show a solid-state imaging device, in particular, photodiode regions as photoelectric conversion portions, according to a tenth embodiment of the present invention. FIG. 17 is a sectional view corresponding to the sectional view taken along line A-A shown in FIG. 3. FIG. 18 is a sectional view corresponding to the sectional view taken along line B-B shown in FIG. 3. FIG. 17 and FIG. 18 schematically show only photodiodes for red, green, and blue pixels.

In a solid-state imaging device 56 according to the tenth embodiment, n-type semiconductor regions 24 of photodiodes 23R, 23G, and 23B respectively for red, green, and blue pixels are formed with different depths with which fundamental absorptions for individual colors occur. In other words, the depths of the n-type semiconductor regions 24 differ in the red, green, and blue pixels. In this embodiment, a polysilicon film 28 that absorbs short-wavelength side light (namely, blue light) is formed only on the photodiode 23G for the green pixel through an insulation film 25.

In this embodiment, since the n-type semiconductor region 24 of the photodiode 23G for the green pixel is shallower than the n-type semiconductor region 24 of the pixel photodiode 23R for the red pixel, the n-type semiconductor region 24 for the red pixel partly extends immediately below the n-type semiconductor region 24 for the green pixel. In addition, since the n-type semiconductor region 24 of the photodiode 23B for the blue pixel is shallower than the n-type semiconductor region 24 of the pixel photodiode 23G for the green pixel, the n-type semiconductor region 24 for the green pixel partly extends immediately below the n-type semiconductor region 24 for the blue pixel. Since the other structures of the solid-state imaging device 56 according to the tenth embodiment are the same as those of the first embodiment shown in FIG. 2A and FIG. 2B, similar portions are denoted by corresponding reference numerals and their redundant description will be omitted.

In the solid-state imaging device 56 according to the tenth embodiment, as described above, the polysilicon film 28 can improve the spectral sensitivity characteristic for green. Likewise, since the n-type semiconductor region 24 for the red pixel extends immediately below the n-type semiconductor region 24 for the green pixel, the area of the photodiode 23R for the red pixel increases, resulting in improvement of the sensitivity of the red pixel. Likewise, since the n-type semiconductor region 24 for the green pixel extends immediately below the n-type semiconductor region 24 for the blue pixel, the area of the photodiode 23G for the green pixel increases, resulting in improvement of the sensitivity of the green pixel.

In the embodiments in which photodiodes for red, green, and blue are formed with their fundamental absorption depths, various modifications may be contemplated that a photodiode for one pixel may extend immediately below a photodiode of a pixel adjacent thereto and/or a polysilicon film may be formed as an absorption film as modifications of the embodiments.

As modifications of these embodiments of the present invention, a polysilicon film that absorbs the short-wavelength side light is formed on a photodiode for green or red pixel. The photodiodes for red, green, and blue pixels are formed with their fundamental absorption depths. The photodiode for the red pixel may partly extend immediately below the photodiode for the green pixel. Instead, the photodiode for green may partly extend immediately below the photodiode for the blue pixel.

As another modification of the embodiments of the present invention, a polysilicon film that absorbs short-wavelength side light is formed on photodiodes for green and red pixels through an insulation layer. The photodiodes for red, green, and blue pixels are formed with their fundamental absorption depths. The photodiode for the red pixel may partly extend immediately below the photodiode for the green pixel. Instead or in addition, the photodiode for the green pixel may partly extend immediately below the photodiode for the blue pixel.

Figure 19:
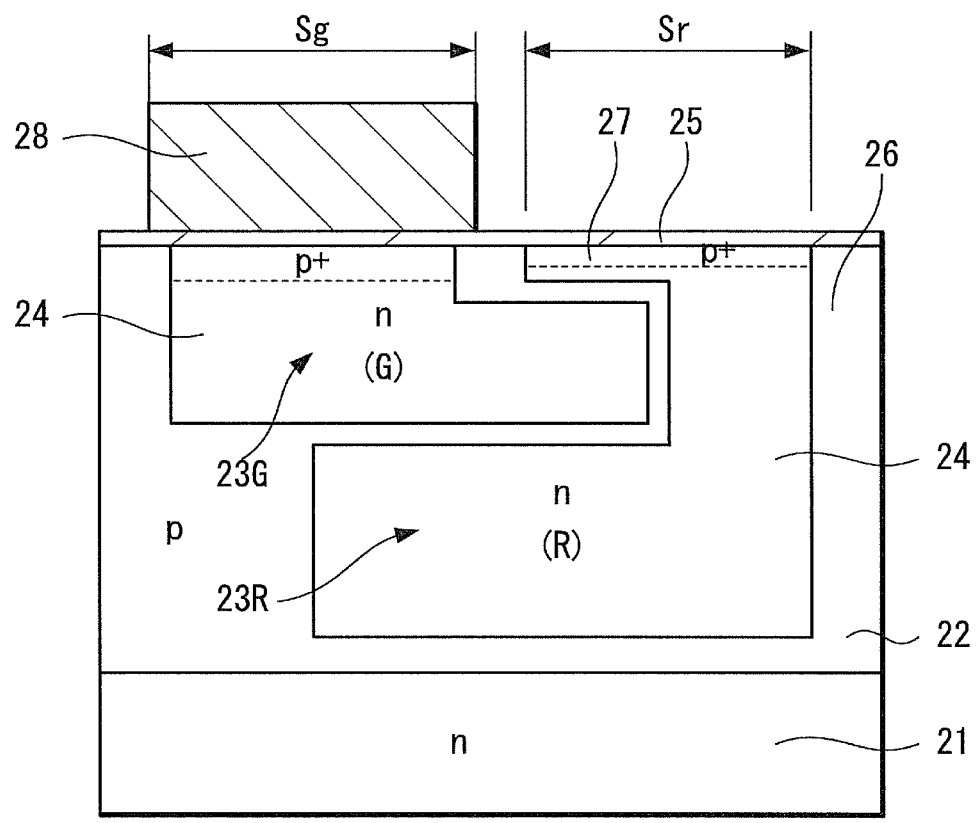
FIG. 19 is a schematic diagram showing a structure of principal portions of a solid-state imaging device according to an eleventh embodiment of the present invention.

FIG. 19 shows a solid-state imaging device, in particular, photodiode regions as photoelectric conversion portions, according to an eleventh embodiment of the present invention. FIG. 19 schematically shows photodiodes for red and green pixels.

In a solid-state imaging device 58 according to the eleventh embodiment, n-type semiconductor regions 24 of photodiodes 23R, 23G, and 23B for red, green, and blue pixels are formed with depths with which fundamental absorptions for individual colors occur. In other words, the depths of the n-type semiconductor regions 24 differ in red, green, and blue pixels. In this embodiment, a polysilicon film 28 that absorbs short-wavelength side light (namely, blue light) is formed only on the photodiode 23G for the green pixel through an insulation film 25.

In this embodiment, since the n-type semiconductor region 24 of the photodiode 23G for the green pixel and the n-type semiconductor region 24 of the pixel photodiode 23R for the red pixel are formed with the same surface width Sg and Sr, respectively, the n-type semiconductor regions 24 for the green and red pixels penetrate into each other. In other words, the n-type semiconductor region 24 for the green pixel partly penetrates into a concave portion immediately below the front surface portion of the n-type semiconductor region 24 for the red pixel and the n-type semiconductor region 24 for the red pixel partly extends immediately below the extended portion of the n-type semiconductor region 24 for the green pixel. Since the other structures of the solid-state imaging device 56 according to the eleventh embodiment are the same as those of the first embodiment shown in FIG. 2A and FIG. 2B, similar portions are denoted by corresponding reference numerals and their redundant description will be omitted.

In the solid-state imaging device 58 according to the eleventh embodiment, since the polysilicon film 28 is formed and the n-type semiconductor region 24 is formed with a depth with which a fundamental absorption occurs, as described above, the spectral sensitivity characteristic for green can be improved. In addition, the n-type semiconductor regions 24 for the red and green pixels partly extend such that they penetrate into each other. As a result, the areas of the photodiode 23R for the red pixel and the photodiode 23G for the green pixel increase, resulting in improvement of sensitivities of the red and green pixels. Since the front surface Sr of the n-type semiconductor region 24 for the red pixel is the same as the front surface Sg of the n-type semiconductor region 24 for the green pixel, their saturation signal charge amounts (Qs) are the same. In this structure, a polysilicon film as an absorption film that absorbs the short-wavelength side light may be formed on the photodiode 23R for the red pixel.

Figure 20A:
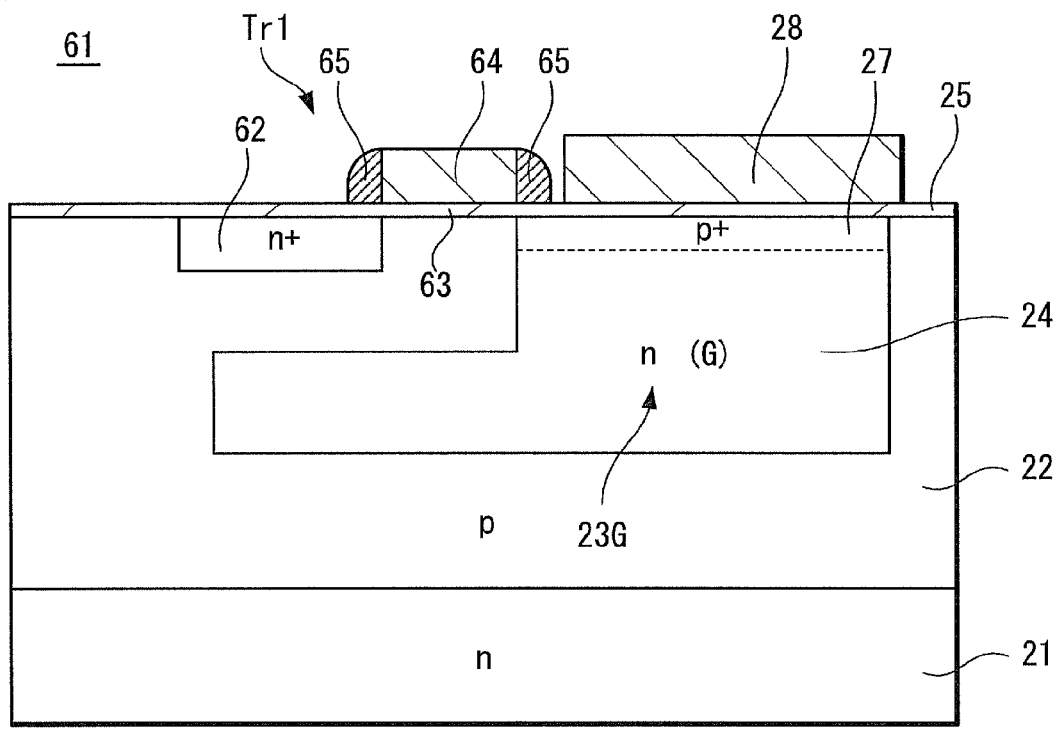
FIG. 20A and FIG. 20B are schematic diagrams showing structures of principal portions of a solid-state imaging device according to a twelfth embodiment of the present invention.
Figure 20B:
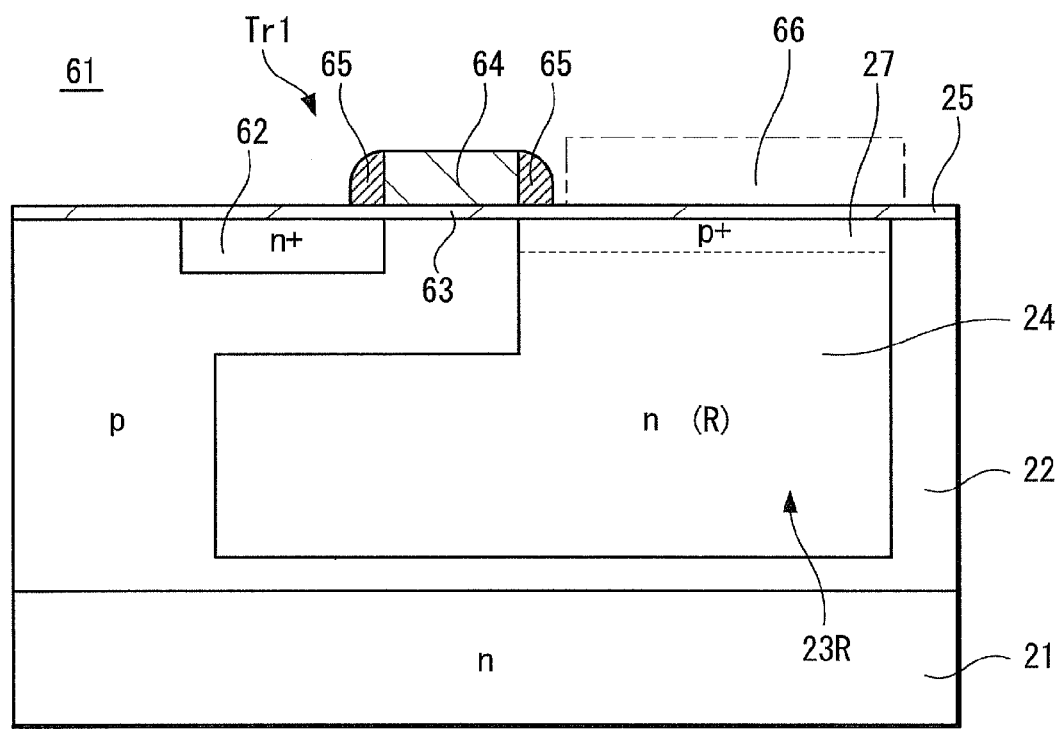

FIG. 20A and FIG. 20B show a solid-state imaging device, in particular, photodiode regions and pixel transistors as photoelectric conversion portions, according to a twelfth embodiment of the present invention. FIG. 20A and FIG. 20B schematically show regions for green and red pixels, respectively.

In a solid-state imaging device 61 according to the twelfth embodiment, an n-type semiconductor region 24, for example, of a photodiode 23G for a green pixel is formed with a depth with which the fundamental absorption for green occurs as shown in FIG. 20A. In addition, an n-type semiconductor region 24 of a photodiode 23R for a red pixel is formed with a depth with which the fundamental absorption for red occurs as shown in FIG. 20B. Likewise, an n-type semiconductor region 24 of a photodiode 23B for a blue pixel is formed with a depth with which the fundamental absorption for blue occurs (not shown). As described above, the n-type semiconductor regions 24 are formed with different widths such that the n-type semiconductor region 24 for the red pixel has the largest depth, the n-type semiconductor region 24 for the green pixel has the next largest depth, and the n-type semiconductor region 24 for the blue pixel has the smallest depth.

A transfer transistor Tr1 is formed such that it is connected to the photodiodes 23R, 23G, and 23B for individual color pixels. In other words, the transfer transistor Tr1 is formed of a transfer gate electrode 64 disposed between each of the photodiodes 23R, 23G, and 23B and a floating diffusion portion (FD) 62 as a first conductivity-type n-type semiconductor region through a gate insulation layer 63. The transfer gate electrode 64 is made, for example, of p-type or n-type polysilicon. A sidewall 65 is formed around the transfer gate electrode 64. The sidewall 65 can be made of an insulation layer, p-type, n-type, or non-doped polysilicon through an insulation layer. In addition, pixel transistors (not shown) other than the transfer transistor are also formed in each pixel.

As shown in FIG. 20A, an absorption film (in this embodiment, a polysilicon film 28) that absorbs the short-wavelength side light (namely, blue light) through the insulation film 25 is formed on the photodiode 23G for the blue pixel. In contrast, a polysilicon film as an absorption film is not formed on the photodiode 23R for the red pixel. Instead, a polysilicon film 66 is formed on the photodiode 23R for the red pixel with a film thickness equal to or larger than that of the polysilicon film 28 for the green pixel as represented by a dashed line.

In this embodiment, the photodiode 23G for the green pixel partly extends immediately below a pixel transistor, the region of the transfer transistor Tr1 in the example shown in FIG. 20A. Instead, the photodiode 23G partly extends immediately below the region of a pixel transistor including the transfer transistor. In addition, the photodiode 23R for the red pixel partly extends immediately below a pixel transistor, the region of the transfer transistor Tr1 in the example shown in FIG. 20B. Instead, the photodiode 23R for the red pixel partly extends immediately below the region of a pixel transistor including the transfer transistor. Since the other structures of the solid-state imaging device of the twelfth embodiment are the same as those of the first embodiment shown in FIG. 2A and FIG. 2B, similar portions are denoted by corresponding reference numerals and their redundant description will be omitted.

In the solid-state imaging device 61 according to the twelfth embodiment, as described above, the polysilicon film 28 can improve the spectral sensitivity characteristic for green. In addition, the polysilicon film 66 can improve the red spectral sensitivity characteristic. In addition, the n-type semiconductor regions 24 of the photodiodes 23G and 23R respectively for the green pixel and red pixel partly extend immediately below a region of a pixel transistor, resulting in improvement of sensitivities of green and red pixels.

The depth of a photodiode that partly extends immediately below an adjacent pixel, namely a photodiode and/or a pixel transistor from the front surface of the silicon substrate can be decided based on a depth that satisfies a region with which a desired spectral ratio is achieved.

The solid-state imaging devices according to the foregoing embodiments can be applied to frontside-illuminated solid-state imaging devices and backside-illuminated solid-state imaging devices. In the backside-illuminated CMOS solid-state imaging device, a plurality of wiring layers are formed on the front side of the substrate and a light sensing surface of photodiodes is formed on the rear surface side of the substrate.

The foregoing embodiments of the present invention may be combined.

The solid-state imaging devices according to the foregoing embodiments and modifications are not limited to area image sensors in which pixels are two-dimensionally arranged in a matrix. In addition, the solid-state imaging devices according to the foregoing embodiments and modifications can be applied to linear image sensors in which pixels are arranged one-dimensionally.

In the foregoing embodiments and modifications, signal charges are formed as electrons. Instead, signal charges can be also formed as holes. In this case, the individual semiconductor regions are formed as those having the reverse conductivity-type of the foregoing.

The solid-state imaging devices according to the foregoing embodiments and modifications can be applied to electronic devices including a camera, a portable device with a built-in camera, and other devices with a built-in solid-state imaging device.

Figure 21:
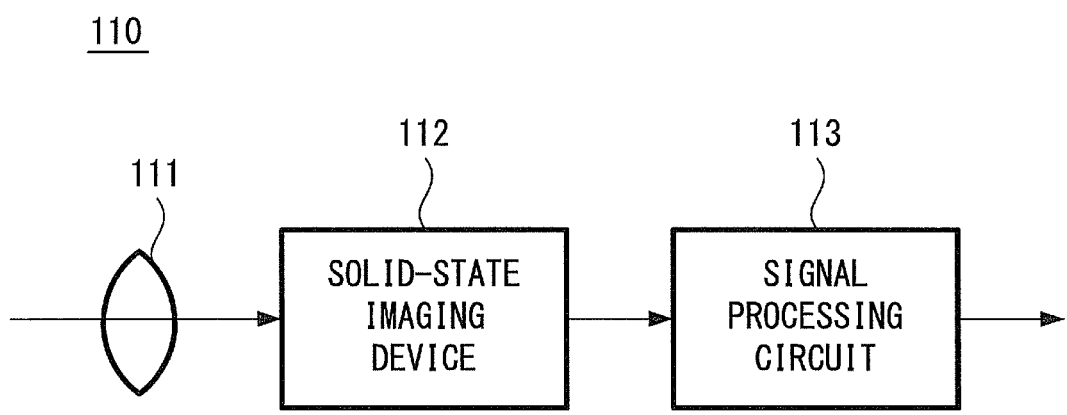
FIG. 21 is a schematic diagram showing an outlined structure of a camera as an electronic device according to an embodiment of the present invention.

FIG. 21 is a block diagram showing a structure of a camera as an electronic device according to an embodiment of the present invention. A camera 110 according to this embodiment includes an optical system (optical lens) 111, a solid-state imaging device 112, and a signal processing circuit 113. The solid-state imaging device 112 is one of those according to the foregoing embodiments and modifications. The optical system 111 focuses light of an image of an object (incident light) on an imaging plane of the solid-state imaging device 112. Thus, signal charges are accumulated in a photoelectric conversion element of the solid-state imaging device 112 for a desired period. The signal processing circuit 113 performs various types of signal processes for an output signal of the solid-state imaging device 112 and outputs the resultant signal. The camera 110 according to this embodiment of the present invention includes a module-type camera having modules of the optical system 111, the solid-state imaging device 112, and the signal processing circuit 113.

An embodiment of the present invention can be applied to the camera shown in FIG. 21 and a portable device with a built-in camera typified by a mobile phone having a camera module.

In addition, the camera shown in FIG. 21 can be structured as imaging function modules having an imaging function as modules of the optical system 111, the solid-state imaging device 112, and the signal processing circuit 113. An embodiment of the present invention can be applied to an electronic device having such an imaging function module.

Since the electronic devices according to the foregoing embodiments have the foregoing solid-state imaging device, color mixtures (crosstalk between pixels) can be decreased in photoelectric conversion portions, resulting in improving image quality.

The present application contains subject matter related to that disclosed in Japanese Priority Patent Application JP 2008-126320 filed in the Japan Patent Office on May 13, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A solid-state imaging device having:
   a substrate layer;
   a plurality of photoelectric conversion portions in the substrate layer configured to convert light within a given wavelength ranges into electric charges;
   an isolation region between each of the plurality of photoelectric conversion portions;
   an absorption film extending over (i) an entirety of at least one of the plurality of photoelectric conversion portions and (ii) at least some portions of the isolation region, wherein the absorption film does not extend over at least a portion of the isolation region, the absorption film operable to absorb short wavelength-side light that would otherwise enter the at least one of the plurality of photoelectric conversion portions, the short wavelength-side light being light having a wavelength shorter than at least one of the given wavelength ranges; and an insulation film spacing the at least one of the plurality of photoelectric conversion portions and the absorption film, the insulation film in contact with the substrate layer, the photoelectric conversion portions, and the absorption film, wherein light falls on the absorption film.

2. The solid-state imaging device as set forth in claim 1, wherein the plurality of photoelectric conversion portions include a photoelectric conversion portion for red light and a photoelectric portion for green light, wherein the photoelectric portion for red light partly extends immediately below the photoelectric conversion portion for green light.

3. The solid-state imaging device as set forth in claim 1, wherein the plurality of photoelectric conversion portions include a photoelectric conversion portion for green light partly extending immediately below a photoelectric conversion portion for blue light, or a photoelectric conversion portion for red light partly extending immediately below a photoelectric conversion portion for green light.

4. The solid-state imaging device as set forth in claim 1, wherein the plurality of photoelectric conversion portions include a photoelectric conversion portion for red light wherein an insulation film having a refractive index smaller than that of the absorption film is formed around the absorption film on the photoelectric conversion portion for red light.

5. The solid-state imaging device as set forth in claim 1, wherein the absorption film is made of a non-single crystal silicon film.

6. The solid-state imaging device as set forth in claim 1, wherein the absorption film is partly or wholly made of a metal silicide film.

7. The solid-state imaging device as set forth in claim 1, wherein the plurality of photoelectric conversion portions include a photoelectric conversion portion for green light partly extending immediately below a photoelectric conversion portion for blue light, and a photoelectric conversion portion for red light partly extending immediately below a photoelectric conversion portion for green light.

8. The solid-state imaging device as set forth in claim 1, wherein different ones of the plurality of photoelectric conversion portions extend to variable depths in the substrate layer relative to the insulation film based on a number of layered ion-injection regions.

9. The solid-state imaging device as set forth in claim 1, wherein the plurality of photoelectric conversion portions include (i) a photoelectric conversion portion for red light that extends to a first depth in the substrate layer relative to the insulation film, (ii) a photoelectric conversion portion for green light that extends to a second depth in the substrate layer that is less than the first depth, and (iii) a photoelectric conversion portion for blue light that extends to a third depth in the substrate layer that is less than the second depth.

10. The solid-state imaging device as set forth in claim 1, wherein the absorption film has a film thickness that is selected based on a chosen absorption of specific wavelength light.

11. The solid-state imaging device as set forth in claim 1, wherein the absorption film has a film thickness that is formed to obtain a chosen spectral sensitivity characteristic.

12. The solid-state imaging device as set forth in claim 1, wherein the substrate layer comprises a well region and a substrate region, wherein the substrate region is in contact with the well region and not in contact with the plurality of photoelectric conversion portions, and wherein light does not enter the substrate region.

13. The solid-state imaging device as set forth in claim 1, wherein the insulation film has a refractive index smaller than that of the absorption film.

14. The solid-state imaging device as set forth in claim 1, wherein solid-state imaging device does not comprise color filters.

15. The solid-state imaging device as set forth in claim 1, wherein the absorption film does not extend over at least one of the plurality of photoelectric conversion portions in the substrate layer.

16. The solid-state imaging device as set forth in claim 1, wherein the insulation film comprises a silicon nitride film that absorbs light having a blue wavelength range of 400 nm to 500 nm.

17. An electronic device, comprising:
a solid-state imaging device;
an optical system configured to guide incident light to the solid-state imaging device; and
a signal processing circuit configured to process an output signal of the solid-state imaging device,
wherein the solid-state imaging device has (a) a substrate layer, (b) a plurality of photoelectric conversion portions in the substrate layer configured to convert light within given wavelength ranges into electric charges, (c) an isolation region between each of the plurality of photoelectric conversion portions, (d) an absorption film extending over (i) at least one of the photoelectric conversion portions and (ii) at least some portions of the isolation region, wherein the absorption film does not extend over at least a portion of the isolation region, the absorption film operable to absorb short wavelength-side light that would otherwise enter the at least one of the plurality of photoelectric conversion portions, the short wavelength-side light being light having a wavelength shorter than at least one of the given wavelength range, and (e) an insulation film spacing the at least one of the plurality of photoelectric conversion portions and the absorption film, the insulation film in contact with the substrate layer, the photoelectric conversion portions, and the absorption film, wherein light falls on the absorption film.

18. The electronic device as set forth in claim 17, wherein the plurality of photoelectric conversion portions includes (a) a photoelectric conversion portion for red light partly extending immediately below a photoelectric conversion portion for green light, or (b) a photoelectric conversion portion for green light partly extending immediately below a photoelectric conversion portion for blue light.

19. The electronic device as set forth in claim 17, wherein the plurality of photoelectric conversion portions includes (a) a photoelectric conversion portion for red light partly extending immediately below a photoelectric conversion portion for green light and (b) a photoelectric conversion portion for green light partly extending immediately below a photoelectric conversion portion for blue light.

20. The electronic device as set forth in claim 17, wherein different ones of the plurality of photoelectric conversion portions extend to variable depths in the substrate layer relative to the insulation film based on a number of layered ion-injection regions.

21. The electronic device as set forth in claim 17, wherein the plurality of photoelectric conversion portions include (i) a photoelectric conversion portion for red light that extends to a first depth in the substrate layer relative to the insulation film, (ii) a photoelectric conversion portion for green light that extends to a second depth in the substrate layer that is less than the first depth, and (iii) a photoelectric conversion portion for blue light that extends to a third depth in the substrate layer that is less than the second depth.

* * * * *